(12) United States Patent
Yokouchi

(10) Patent No.: US 9,082,728 B2
(45) Date of Patent: Jul. 14, 2015

(54) HEAT TREATMENT METHOD AND HEAT TREATMENT APPARATUS FOR HEATING SUBSTRATE BY EMITTING FLASHING LIGHT

(75) Inventor: Kenichi Yokouchi, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 463 days.

(21) Appl. No.: 13/177,696

(22) Filed: Jul. 7, 2011

(65) Prior Publication Data
US 2011/0262115 A1 Oct. 27, 2011

(51) Int. Cl.
| | |
|---|---|
| *F27D 11/12* | (2006.01) |
| *H01L 21/324* | (2006.01) |
| *H01L 21/67* | (2006.01) |
| *H01L 21/687* | (2006.01) |
| *H01L 29/66* | (2006.01) |

(52) U.S. Cl.
CPC ........ *H01L 21/324* (2013.01); *H01L 21/67115* (2013.01); *H01L 21/68707* (2013.01); *H01L 29/6659* (2013.01)

(58) Field of Classification Search
CPC ............ H01L 21/67109; H01L 21/324; H01L 21/3245; H01L 21/67115; H01L 21/68707; H01L 29/6659; B23K 26/0057; F24C 14/02
USPC ........... 219/411, 412, 492; 392/416; 438/795, 438/796, 797
See application file for complete search history.

(56) References Cited

U.S. PATENT DOCUMENTS

| | | | | |
|---|---|---|---|---|
| 4,649,261 | A * | 3/1987 | Sheets ........................ | 219/390 |
| 4,698,486 | A * | 10/1987 | Sheets ........................ | 219/390 |
| 6,222,990 | B1 * | 4/2001 | Guardado et al. ........... | 392/416 |
| 6,454,863 | B1 * | 9/2002 | Halpin ........................ | 118/725 |
| 6,849,831 | B2 * | 2/2005 | Timans et al. ............... | 219/390 |
| 6,936,797 | B2 | 8/2005 | Hosokawa .................... | 219/405 |
| 6,951,996 | B2 * | 10/2005 | Timans et al. ............... | 219/390 |
| 6,998,580 | B2 * | 2/2006 | Kusuda et al. .............. | 219/411 |
| 7,102,141 | B2 * | 9/2006 | Hwang et al. ............ | 250/455.11 |
| 7,223,660 | B2 * | 5/2007 | Hwang ........................ | 438/289 |

(Continued)

FOREIGN PATENT DOCUMENTS

| | | |
|---|---|---|
| JP | 2002-252174 | 9/2002 |
| JP | 2005-527972 | 9/2005 |

(Continued)

OTHER PUBLICATIONS

Office Action dated Nov. 19, 2013 issued in corresponding Japanese Patent Application No. 2010-018732 with partial English translation (7 pages).

*Primary Examiner* — Tu B Hoang
*Assistant Examiner* — Jimmy Chou
(74) *Attorney, Agent, or Firm* — Ostrolenk Faber LLP

(57) ABSTRACT

A first flash heating is performed in which a flash lamp emits a first flashing light to a semiconductor wafer having been heated to a first preheating temperature equal to or lower than 650 degrees C. by a light emission from a halogen lamp so that the temperature of a surface of the semiconductor wafer reaches 1000 degrees C. or higher. Then, a second flash heating is performed in which a second flashing light is emitted to the semiconductor wafer having been further heated by a light emission of the halogen lamp. Performing the first flash heating can suppress diffusion of impurity in the subsequent second flash heating. In the second flash heating, the impurity is activated and introduced crystal defects are recovered.

24 Claims, 16 Drawing Sheets

(56) References Cited

U.S. PATENT DOCUMENTS

| | | | |
|---|---|---|---|
| 7,327,947 B2* | 2/2008 | Kusuda | 392/416 |
| 7,704,898 B2* | 4/2010 | Nenyei et al. | 438/795 |
| 7,935,913 B2* | 5/2011 | Kusuda | 219/411 |
| 7,973,266 B2* | 7/2011 | Nakajima et al. | 219/521 |
| 8,058,134 B2* | 11/2011 | Wang et al. | 438/306 |
| 8,173,937 B2* | 5/2012 | Yokouchi | 219/411 |
| 8,238,731 B2* | 8/2012 | Nakajima | 392/416 |
| 2002/0195437 A1* | 12/2002 | Kusuda | 219/390 |
| 2003/0013280 A1 | 1/2003 | Yamanaka | 438/487 |
| 2003/0080104 A1* | 5/2003 | Kusuda | 219/390 |
| 2003/0183612 A1 | 10/2003 | Timans et al. | 219/390 |
| 2004/0149715 A1* | 8/2004 | Timans et al. | 219/390 |
| 2004/0169032 A1* | 9/2004 | Murayama et al. | 219/411 |
| 2004/0206743 A1* | 10/2004 | Murayama | 219/390 |
| 2005/0098552 A1* | 5/2005 | Timans | 219/390 |
| 2005/0112907 A1* | 5/2005 | Yoo | 438/795 |
| 2005/0236395 A1* | 10/2005 | Timans et al. | 219/497 |
| 2005/0258162 A1* | 11/2005 | Kusuda et al. | 219/411 |
| 2005/0274709 A1* | 12/2005 | Kusuda | 219/411 |
| 2006/0081596 A1* | 4/2006 | Kusuda et al. | 219/411 |
| 2006/0292895 A1* | 12/2006 | Tsai | 438/795 |
| 2007/0087492 A1 | 4/2007 | Yamanaka | 438/166 |
| 2008/0069550 A1 | 3/2008 | Timans et al. | 392/411 |
| 2008/0143268 A1 | 6/2008 | Torikai et al. | 315/195 |
| 2008/0247739 A1* | 10/2008 | Sohtome | 392/416 |
| 2009/0166351 A1* | 7/2009 | Yokomori | 219/492 |
| 2009/0175605 A1* | 7/2009 | Kobayashi | 392/416 |
| 2009/0197427 A1 | 8/2009 | Yoneda et al. | 438/795 |
| 2009/0197428 A1* | 8/2009 | Takahashi et al. | 438/799 |
| 2009/0245761 A1* | 10/2009 | Nakajima | 392/416 |
| 2010/0151696 A1 | 6/2010 | Ito et al. | 438/798 |
| 2011/0236844 A1* | 9/2011 | Timans et al. | 432/49 |

FOREIGN PATENT DOCUMENTS

| | | |
|---|---|---|
| JP | 2008-147533 | 6/2008 |
| JP | 2009-164451 | 7/2009 |
| JP | 2009-188209 | 8/2009 |
| JP | 2009-188210 | 8/2009 |
| JP | 2009-231694 | 10/2009 |
| JP | 2010-141103 | 6/2010 |

* cited by examiner

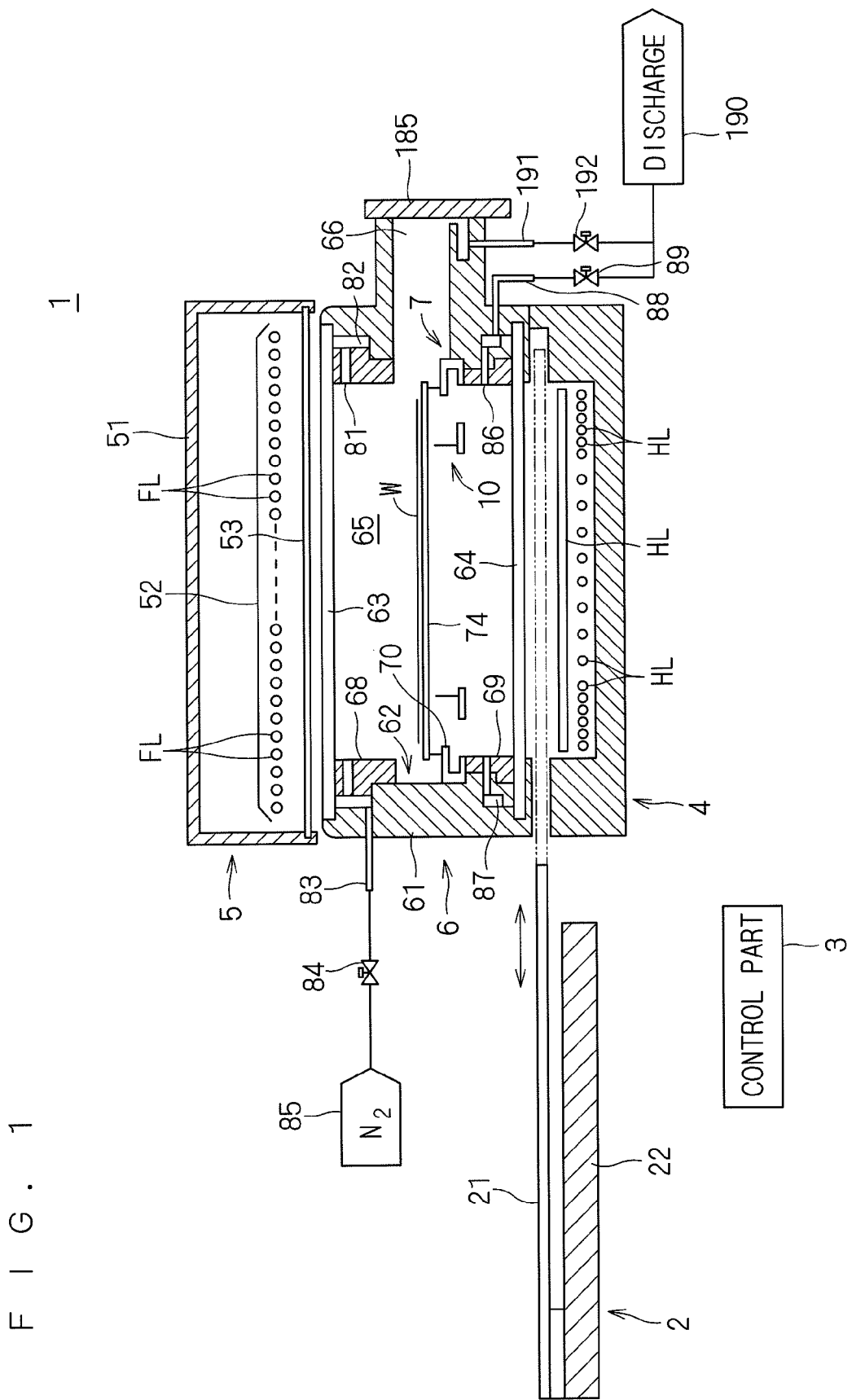
F I G. 1

F I G. 3
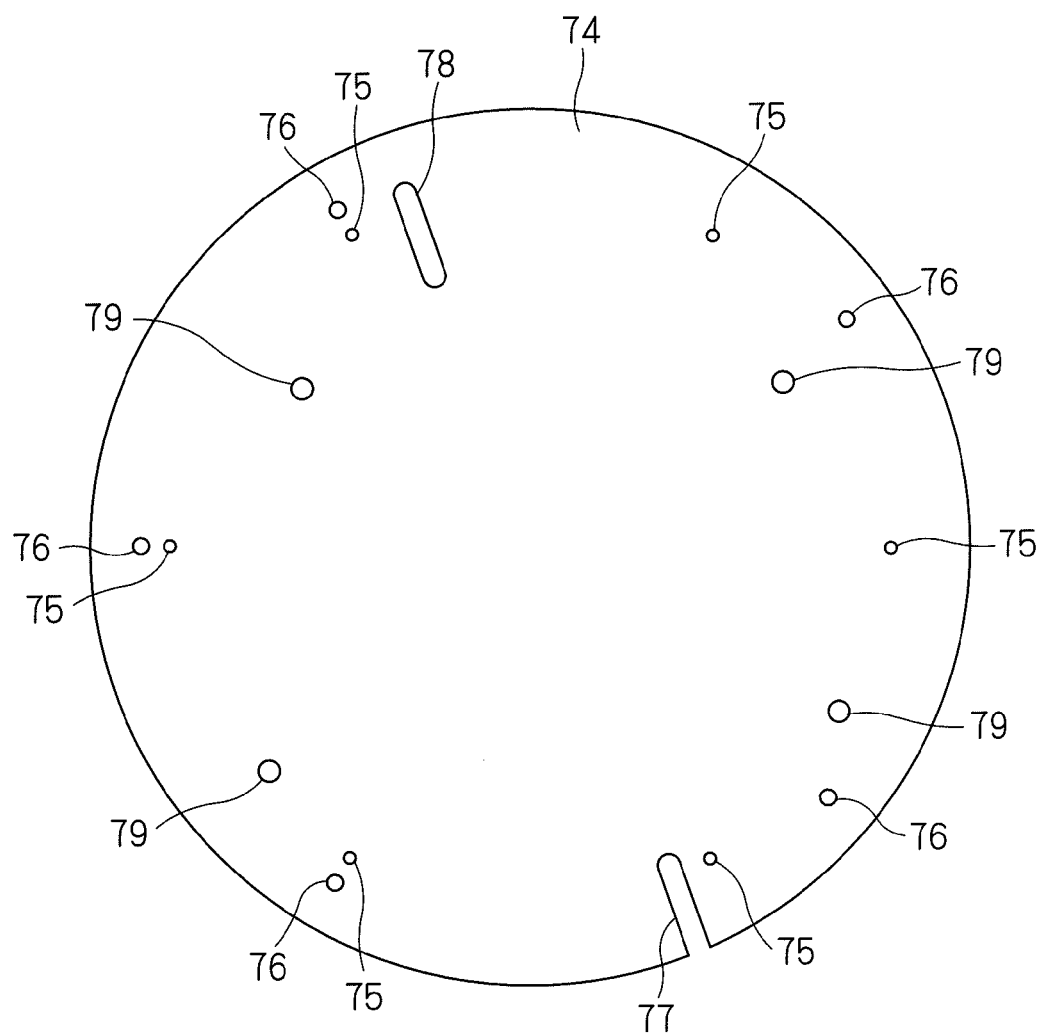

F I G . 4
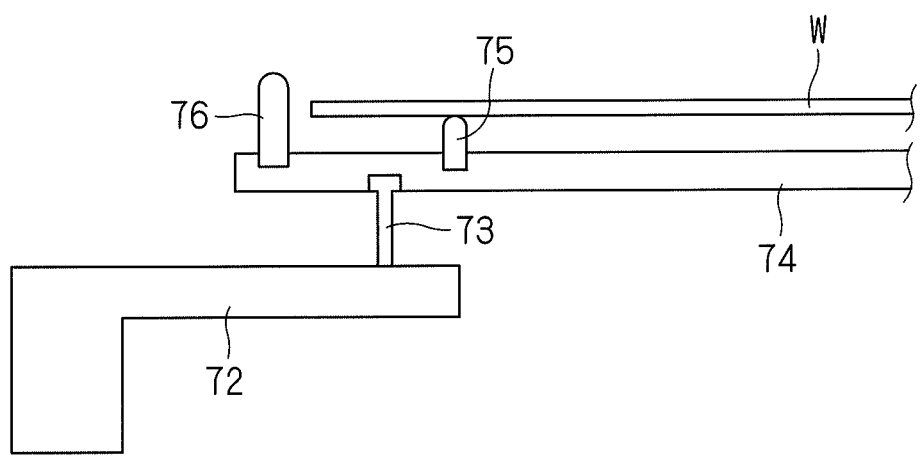

F I G. 8
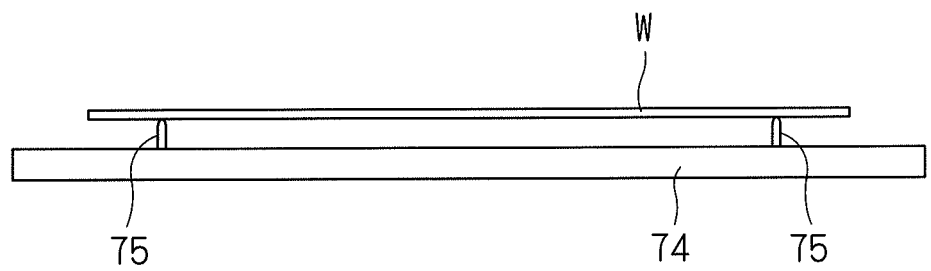

F I G . 1 0
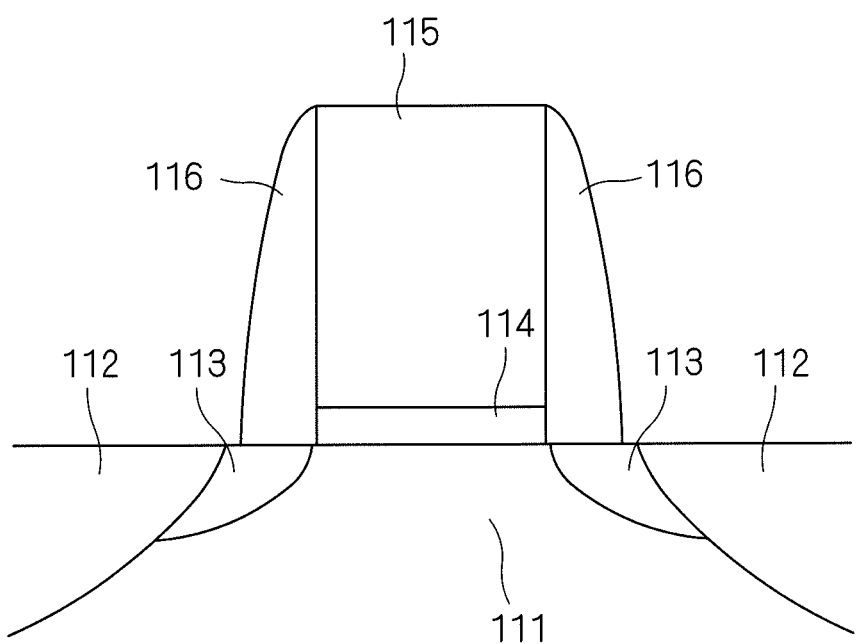

F I G . 1 4
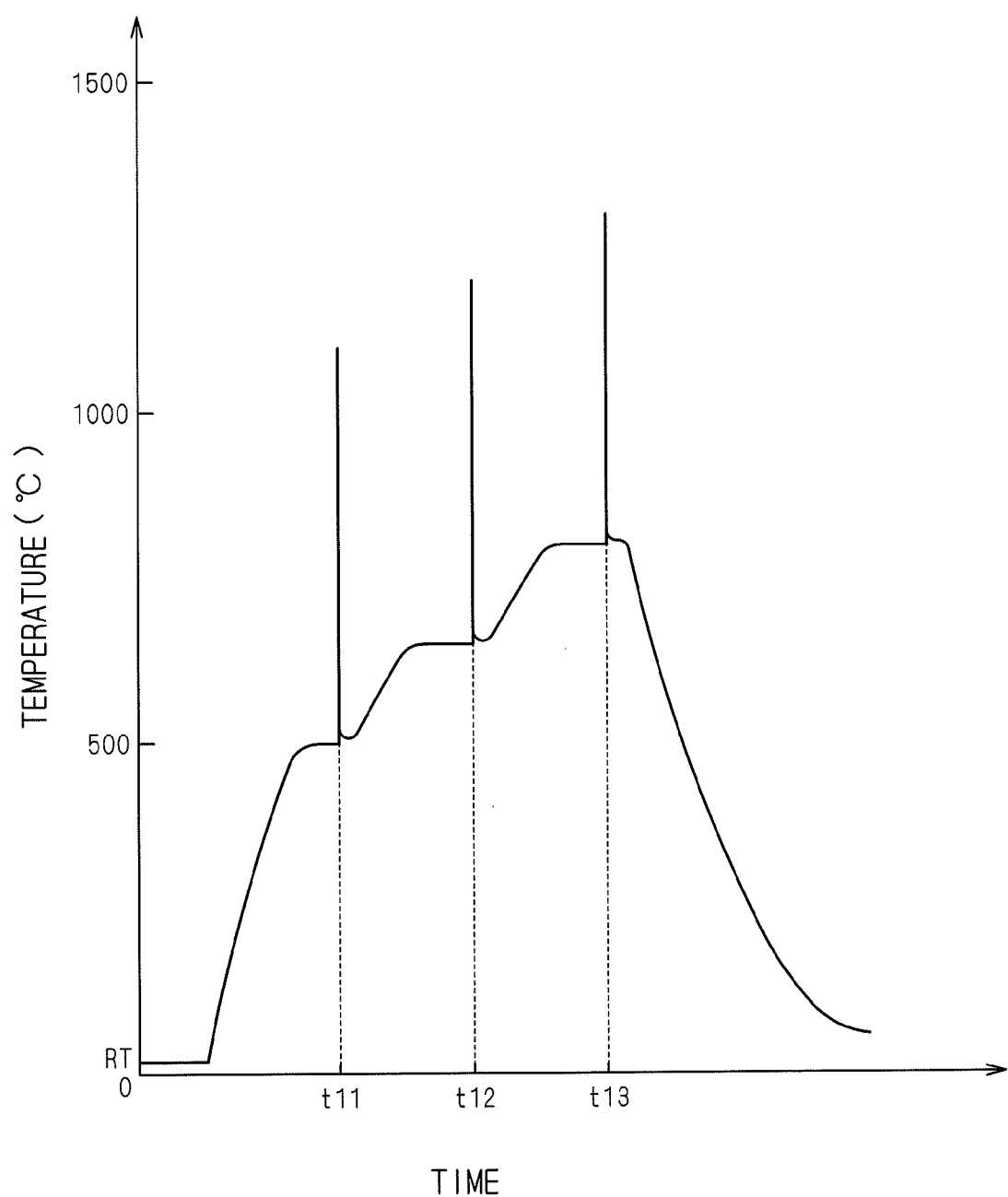

HEAT TREATMENT METHOD AND HEAT TREATMENT APPARATUS FOR HEATING SUBSTRATE BY EMITTING FLASHING LIGHT

BACKGROUND OF THE INVENTION

1. Field of the Invention

The present invention relates to a heat treatment method and a heat treatment apparatus for emitting a light to a thin-plate-type precision electronic substrate (hereinafter simply referred to as a "substrate") such as a semiconductor wafer or a glass substrate for a liquid crystal display device, to thereby heat the substrate.

2. Description of the Background Art

Conventionally, a lamp annealer including a halogen lamp has been generally used in a process of activating impurity (ion) of a semiconductor wafer after ion implantation. In such a lamp annealer, the semiconductor wafer is heated (annealed) to a temperature of, for example, approximately 1000 to 1100 degrees C., to thereby achieve an activation of the impurity of the semiconductor wafer. In this heat treatment apparatus, energy of a light emitted from the halogen lamp is utilized to raise the temperature of the semiconductor wafer at a rate of approximately several hundreds of degrees C. per second.

In recent years, a high integration of a semiconductor device is being advanced. As a gate length is accordingly shortened, a reduction in a junction depth is demanded. However, the fact has been revealed that even when the above-mentioned lamp annealer that raises the temperature of the semiconductor wafer at a rate of approximately several hundreds of degrees C. per second is used for activating the impurity of the semiconductor wafer, a phenomenon still occurs in which the impurity such as boron or phosphorus implanted in the semiconductor wafer is diffused deeply. Occurrence of such a phenomenon makes a junction depth deeper than required, which may undesirably obstruct the formation of a good device.

Accordingly, for example, U.S. Pat. Nos. 6,998,580 and 6,936,797 propose a technique in which a xenon flash lamp (hereinafter, the xenon flash lamp will be meant by the simple wording of "flash lamp") is used to emit a flashing light to a surface of a semiconductor wafer so that the temperature of only the surface of the ion-implanted semiconductor wafer is raised to approximately 1100 degrees C. in an extremely short time period (equal to or shorter than a few milliseconds). A spectral distribution of the emission of the xenon flash lamp extends over an ultraviolet region through a near-infrared region, which has a wavelength shorter than that of a conventional halogen lamp and is substantially coincident with a fundamental absorption band of a silicon semiconductor wafer. Therefore, when a flashing light is emitted from the xenon flash lamp to the semiconductor wafer, the temperature of the semiconductor wafer can be quickly raised with a small amount of transmission light. The fact has also been revealed that an emission of the flashing light in an extremely short time period equal to or shorter than a few milliseconds enables the temperature of a semiconductor wafer to be raised selectively only in a portion near a surface thereof. Thus, if the temperature rise is caused in an extremely short time period by the xenon flash lamp, only an activation of impurity can be achieved without deep diffusion of the impurity.

Here, since an annealing process using the emission of the flashing light can raise the temperature of the surface of the semiconductor wafer up to a high temperature of 1100 degrees C. or higher in an extremely short time period, the process is effective in suppressing diffusion of implanted impurity and in activating the impurity, but is not suitable for recovery of crystal defects in silicon introduced during the implantation of the impurity. If a semiconductor device such as an FET (Field Effect Transistor) is prepared without a sufficient recovery of crystal defects, a problem occurs that a leakage current increases.

SUMMARY OF THE INVENTION

The present invention is directed to a heat treatment method for heating a substrate by emitting a light to the substrate.

In an aspect of the present invention, the heat treatment method includes: (a) a first flash heating step in which a flash lamp emits a flashing light to the substrate having been heated to a first preheating temperature equal to or lower than 650 degrees C. by a light emission from a halogen lamp, so that the temperature of a surface of the substrate reaches 1000 degrees C. or higher; and (b) a second flash heating step, performed after the first flash heating step, in which the flash lamp emits a flashing light to the substrate having been heated to a second preheating temperature higher than the first preheating temperature by a light emission from the halogen lamp.

Diffusion of impurity is suppressed in the first flash heating step in which the flash lamp emits the flashing light to the substrate having been heated to the first preheating temperature equal to or lower than 650 degrees C. by the light emission from the halogen lamp, so that the temperature of the surface of the substrate reaches 1000 degrees C. or higher. In this state, the second flash heating step is performed in which the flash lamp emits the flashing light to the substrate having been heated to the second preheating temperature higher than the first preheating temperature by the light emission from the halogen lamp. Therefore, recovery from defects introduced at a time of impurity implantation can be promoted while diffusion of the implanted impurity is suppressed, and additionally the impurity can be activated in a good manner.

Preferably, the heat treatment method further includes, between the first flash heating step and the second flash heating step, a step of emitting a flashing light from the flash lamp to the substrate.

The impurity can be activated in a further better manner, and the recovery from the defects can be promoted.

Preferably, in a time period of at least two seconds immediately before the flash lamp emits the flashing light in each of the first flash heating step and the second flash heating step, the halogen lamp emits a light to thereby maintain the temperature of the substrate at a constant temperature.

The entire substrate can be uniformly heated to improve the uniformity of a temperature distribution in a plane.

The heat treatment method may further include, after the second flash heating step, a step of emitting a light from the halogen lamp to thereby heat the substrate to a temperature equal to or higher than 1000 degrees C. that exceeds the second preheating temperature.

The defects can be sufficiently recovered while suppressing the diffusion of the impurity.

The heat treatment method may further include, after the second flash heating step, a step of emitting a light from the halogen lamp to thereby maintain the temperature of the substrate at 850 degrees C. or higher and 950 degrees C. or lower for a time period of one second or more and 30 seconds or less.

Defects introduced by the emission of the flashing light can also be recovered.

The present invention is also directed to a heat treatment apparatus for heating a substrate by emitting a light to the substrate.

In an aspect of the present invention, the heat treatment apparatus includes: a support part for supporting the substrate in point contact; a halogen lamp for emitting a light to the substrate supported by the support part; a flash lamp for emitting a flashing light to the substrate supported by the support part; and a light-emission control part for controlling a light emission from the halogen lamp and the flash lamp. The light-emission control part is configured to control the halogen lamp and the flash lamp so as to perform a first flash heating in which the flash lamp emits the flashing light to the substrate having been heated to a first preheating temperature equal to or lower than 650 degrees C. by a light emission from the halogen lamp, so that the temperature of a surface of the substrate reaches 1000 degrees C. or higher, and then perform a second flash heating in which the flash lamp emits the flashing light to the substrate having been heated to a second preheating temperature higher than the first preheating temperature by a light emission from the halogen lamp.

Diffusion of impurity is suppressed in the first flash heating in which the flash lamp emits the flashing light to the substrate having been heated to the first preheating temperature equal to or lower than 650 degrees C. by the light emission from the halogen lamp, so that the temperature of the surface of the substrate reaches 1000 degrees C. or higher. In this state, the second flash heating is performed in which the flash lamp emits the flashing light to the substrate having been heated to the second preheating temperature higher than the first preheating temperature by the light emission from the halogen lamp. Therefore, recovery from defects introduced at a time of impurity implantation can be promoted while diffusion of the implanted impurity is suppressed, and additionally the impurity can be activated in a good manner Preferably, the light-emission control part is configured to control the flash lamp such that the flash lamp further emits the flashing light to the substrate in a time period from the first flash heating to the second flash heating.

The impurity can be activated in a further better manner, and the recovery from the defects can be promoted.

Preferably, the light-emission control part is configured to control the halogen lamp such that the halogen lamp emits a light to thereby maintain the temperature of the substrate at a constant temperature in a time period of at least two seconds immediately before the flash lamp emits the flashing light in each of the first flash heating and the second flash heating.

The entire substrate can be uniformly heated to improve the uniformity of a temperature distribution in a plane.

The light-emission control part may be configured to control the halogen lamp such that, after the second flash heating, the halogen lamp emits a light to thereby heat the substrate to a temperature equal to or higher than 1000 degrees C. that exceeds the second preheating temperature.

The defects can be sufficiently recovered while suppressing the diffusion of the impurity.

The light-emission control part may be configured to control the halogen lamp such that, after the second flash heating, the halogen lamp emits a light to thereby maintain the temperature of the substrate at 850 degrees C. or higher and 950 degrees C. or lower for a time period of one second or more and 30 seconds or less.

Defects introduced by the emission of the flashing light can also be recovered.

Therefore, an object of the present invention is to promote the recovery from the defects introduced at the time of the impurity implantation while suppressing the diffusion of the implanted impurity, and additionally to activate the impurity in a good manner.

These and other objects, features, aspects and advantages of the present invention will become more apparent from the following detailed description of the present invention when taken in conjunction with the accompanying drawings.

BRIEF DESCRIPTION OF THE DRAWING

FIG. 1 is a longitudinal sectional view showing a structure of a heat treatment apparatus according to the present invention.

FIG. 3 is a plan view of a holding plate.

FIG. 4 is an enlarged view of a part near a bump in a state where a semiconductor wafer is placed on the holding plate.

FIG. 8 is a diagram showing the holding plate having the semiconductor wafer held thereon.

FIG. 10 is a diagram showing a structure of an element formed on the semiconductor wafer to be processed by a heat treatment apparatus of FIG. 1.

FIG. 14 is a diagram showing a change in the temperature of a surface of a semiconductor wafer according to a second preferred embodiment.

DESCRIPTION OF THE PREFERRED EMBODIMENTS

Figure 2:
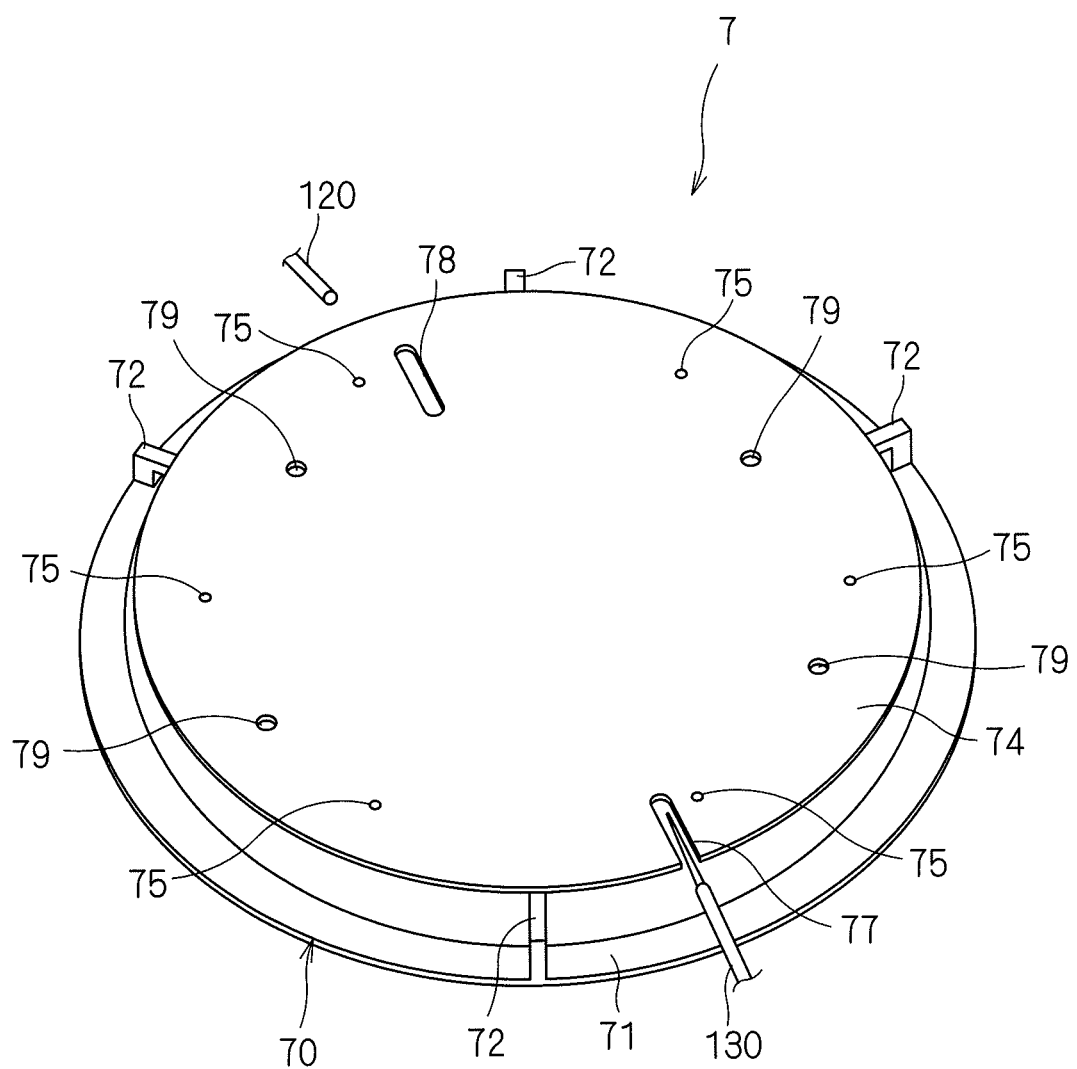
FIG. 2 is a perspective view of a holder.

In the following, some preferred embodiments of the present invention will be described in detail with reference to the accompanying drawings.

1. First Preferred Embodiment

FIG. 1 is a longitudinal sectional view showing a structure of a heat treatment apparatus 1 according to the present invention. The heat treatment apparatus 1 of this preferred embodiment is a flash lamp annealer that emits a light to a substrate which is a semiconductor wafer W of a circular-plate shape with φ300 mm, to thereby heat the semiconductor wafer W. Before being installed in the heat treatment apparatus 1, the semiconductor wafer W is implanted with impurity. A process for activating the implanted impurity is performed through a heat treatment by the heat treatment apparatus 1.

The heat treatment apparatus 1 includes a chamber 6 for accommodating the semiconductor wafer W, a flash heating part 5 having a plurality of flash lamps FL built therein, a halogen heating part 4 having a plurality of halogen lamps HL built therein, and a shutter part 2. The flash heating part 5 is provided on an upper side of the chamber 6, and the halogen heating part 4 is provided on a lower side thereof. The heat treatment apparatus 1 has, inside the chamber 6, a holder 7 for holding the semiconductor wafer W in a horizontal position and a transferring mechanism 10 for transferring the semiconductor wafer W between the holder 7 and the outside of the apparatus. The heat treatment apparatus 1 further includes a control part 3 for controlling operation mechanisms provided in the shutter part 2, the halogen heating part 4, the flash heating part 5, and the chamber 6, thereby performing the heat treatment on the semiconductor wafer W.

In the chamber 6, chamber windows made of quartz are mounted in upper and lower portions of a cylindrical chamber side portion 61. The chamber side portion 61 has a generally cylindrical shape with upper and lower portions thereof being opened. An upper opening is closed by an upper chamber window 63 being mounted thereon. A lower opening is closed by a lower chamber window 64 being mounted thereon. The upper chamber window 63 defining a ceiling of the chamber 6 is a circular-plate-like member made of quartz, and functions as a quartz window that allows lights emitted from the flash heating part 5 to pass therethrough into the chamber 6. The lower chamber window 64 defining a floor of the chamber 6 is also a circular-plate-like member made of quartz, and functions as a quartz window that allows lights emitted from the halogen heating part 4 to pass therethrough into the chamber 6.

A reflective ring 68 and a reflective ring 69 are mounted in an upper portion and a lower portion, respectively, of an inner wall surface of the chamber side portion 61. Each of the reflective rings 68 and 69 is shaped into a circular ring. The upper reflective ring 68 is fitted from an upper side of the chamber side portion 61, and thus mounted thereon. The lower reflective ring 69 is fitted from a lower side of the chamber side portion 61 and fixed with a screw (not shown), and thus mounted thereon. That is, both of the reflective rings 68 and 69 are mounted on the chamber side portion 61 in a removable manner. An inner space of the chamber 6, in other words, a space enclosed by the upper chamber window 63, the lower chamber window 64, the chamber side portion 61, and the reflective rings 68 and 69, is defined as a heat treatment space 65.

The reflective rings 68 and 69 are mounted on the chamber side portion 61, and thereby a recess 62 is formed in an inner wall surface of the chamber 6. More specifically, the recess 62 formed is enclosed by a lower end surface of the reflective ring 68, an upper end surface of the reflective ring 69, and a central portion of the inner wall surface of the chamber side portion 61 in which the reflective rings 68 and 69 are not mounted. The recess 62 is horizontally provided in the inner wall surface of the chamber 6 so as to have a circular ring shape, and surrounds the holder 7 that holds the semiconductor wafer W.

The chamber side portion 61 and the reflective rings 68 and 69 are made of a metal material (such as stainless steel) excellent in the strength and the heat resistance. Inner circumferential surfaces of the reflective rings 68 and 69 are configured as mirror surfaces by electrolytic nickel plating.

A transport opening portion (furnace opening) 66 is formed in the chamber side portion 61, for transporting the semiconductor wafer W into and out of the chamber 6. The transport opening portion 66 can be opened and closed by a gate valve 185. The transport opening portion 66 is connected in communication with an outer circumferential surface of the recess 62. Thus, when the gate valve 185 opens the transport opening portion 66, the semiconductor wafer W can be transported into or out of the heat treatment space 65 from the transport opening portion 66 through the recess 62. When the gate valve 185 closes the transport opening portion 66, the heat treatment space 65 within the chamber 6 is an enclosed space.

A gas supply port 81 for supplying a process gas (in this preferred embodiment, a nitrogen gas ($N_2$)) to the heat treatment space 65 is formed in an upper portion of an inner wall of the chamber 6. The gas supply port 81 is positioned upper than the recess 62, and may be formed in the reflective ring 68. The gas supply port 81 is connected in communication with a gas supply tube 83 through a buffer space 82 having a circular ring shape and formed in an inner side wall of the chamber 6. The gas supply tube 83 is connected to a nitrogen gas supply source 85. A valve 84 is provided in the middle of a path of the gas supply tube 83. When the valve 84 is opened, the nitrogen gas is supplied from the nitrogen gas supply source 85 to the buffer space 82. The nitrogen gas having entered the buffer space 82 flows so as to spread in the buffer space 82 having a lower fluid resistance than that of the gas supply port 81. Then, the nitrogen gas is supplied into the heat treatment space 65 through the gas supply port 81.

A gas discharge port 86 for discharging a gas existing in the heat treatment space 65 is formed in a lower portion of the inner wall of the chamber 6. The gas discharge port 86 is positioned lower than the recess 62, and may be formed in the reflective ring 69. The gas discharge port 86 is connected in communication with a gas discharge tube 88 through a buffer space 87 having a circular ring shape and formed in the inner side wall of the chamber 6. The gas discharge tube 88 is connected to a discharge part 190. A valve 89 is provided in the middle of a path of the gas discharge tube 88. When the valve 89 is opened, the gas existing in the heat treatment space 65 is discharged from the gas discharge port 86 to the gas discharge tube 88 through the buffer space 87. It may be acceptable that a plurality of gas supply ports 81 and a plurality of gas discharge ports 86 are provided along a circumferential direction of the chamber 6, and that the gas supply port 81 and the gas discharge port 86 are formed as slits. Moreover, a mechanism may be acceptable in which the nitrogen gas supply source 85 and the discharge part 190 are provided in the heat treatment apparatus 1, or alternatively the nitrogen gas supply source 85 and the discharge part 190 may be provided as a utility of a factory in which the heat treatment apparatus 1 is installed.

A gas discharge tube 191 for discharging the gas existing in the heat treatment space 65 is connected to a distal end of the transport opening portion 66. The gas discharge tube 191 is connected to the discharge part 190 via a valve 192. When the valve 192 is opened, the gas existing in the chamber 6 is discharged through the transport opening portion 66.

FIG. 2 is a perspective view of the holder 7. The holder 7 includes a susceptor 70 and a holding plate 74. The susceptor 70 is made of quartz. The susceptor 70 includes a ring portion 71 having a circular ring shape, and a plurality of claw members 72 (in this preferred embodiment, four claw members 72) standing on the ring portion 71. FIG. 3 is a plan view of the holding plate 74. The holding plate 74 is a circular flat plate member made of quartz. The diameter of the holding plate 74 is larger than the diameter of the semiconductor wafer W. That is, the holding plate 74 has a larger plane size than that of the semiconductor wafer W. A plurality of bumps 75 are provided standing on an upper surface of the holding plate 74. In this preferred embodiment, six bumps 75 in total are provided at intervals of 60 degrees along the periphery of a circle concentric with the outer peripheral circle of the holding plate 74. The diameter of a circle defined by the arrangement of the six bumps 75 (the distance between opposed bumps 75) is smaller than the diameter of the semiconductor wafer W, and in this preferred embodiment, is φ280 mm. Each of the bumps 75 is a support pin made of quartz. The number of bumps 75 is not limited to six, and may be any number equal to or greater than three which allows stable support of the semiconductor wafer W.

A plurality of guide pins 76 (in this preferred embodiment, five guide pins 76) are provided standing on the upper surface of the holding plate 74 such that the plurality of guide pins 76 can define a circle concentric with the circle defined by the six bumps 75. The diameter of the circle defined by the arrangement of the five guide pins 76 is slightly greater than the diameter of the semiconductor wafer W. Each of the guide pins 76 is made of quartz. Instead of the plurality of guide pins 76, a circular ring member may be provided, the circular ring member having a tapered surface tapered at a predetermined angle relative to the horizontal plane so as to flare upward.

The ring portion 71 is placed on a bottom surface of the recess 62, and thereby the susceptor 70 is mounted in the chamber 6. The holding plate 74 is placed on the claw members 72 of the susceptor 70 thus mounted in the chamber 6. The semiconductor wafer W transported into the chamber 6 is placed in a horizontal position on the holding plate 74 held on the susceptor 70.

FIG. 4 is an enlarged view of a part near the bump 75 in a state where the semiconductor wafer W is placed on the holding plate 74. A support pole 73 is provided standing on each claw member 72 of the susceptor 70. An upper end portion of the support pole 73 is fitted in a recess formed in a lower surface of the holding plate 74, so that the holding plate 74 is held on the susceptor 70 without a positional shift.

The bumps 75 and the guide pins 76 are also standing while being fitted in recesses formed in the upper surface of the holding plate 74. Upper ends of the bumps 75 and the guide pins 76 standing on the upper surface of the holding plate 74 protrude from the upper surface. The semiconductor wafer W is supported, in point contact, by the plurality of bumps 75 standing on the holding plate 74, and thus placed on the holding plate 74. A distance from the height position of the upper end of the bump 75 to the upper surface of the holding plate 74 is 0.5 mm or more and 3 mm or less (in this preferred embodiment, 1 mm). Accordingly, the semiconductor wafer W is supported by the plurality of bumps 75 at a distance of 0.5 mm or more and 3 mm or less from the upper surface of the holding plate 74. The upper end of the guide pin 76 is located higher than the upper end of the bump 75. This enables the plurality of guide pins 76 to prevent a positional shift of the semiconductor wafer W in the horizontal direction. The bumps 75 and the guide pins 76 may be made of quartz integrally with the holding plate 74.

In a case where a circular ring member having the above-mentioned tapered surface is provided instead of the guide pins 76, this circular ring member prevents a positional shift of the semiconductor wafer W in the horizontal direction. In the upper surface of the holding plate 74, at least a region opposed to the semiconductor wafer W supported by the plurality of bumps 75 forms a plane. In this case, the semiconductor wafer W is supported by the plurality of bumps 75 at a distance of 0.5 mm or more and 3 mm or less from the plane of the holding plate 74.

As shown in FIGS. 2 and 3, an opening portion 78 and a cutout portion 77 are formed through the holding plate 74 in the vertical direction. The cutout portion 77 is provided for passing therethrough a distal end portion of a probe of a contact-type thermometer 130 utilizing thermocouple. The opening portion 78 is provided for enabling a radiation thermometer 120 to receive a light (infrared light) emitted from a lower surface of the semiconductor wafer W held on the holding plate 74.

Figure 5:
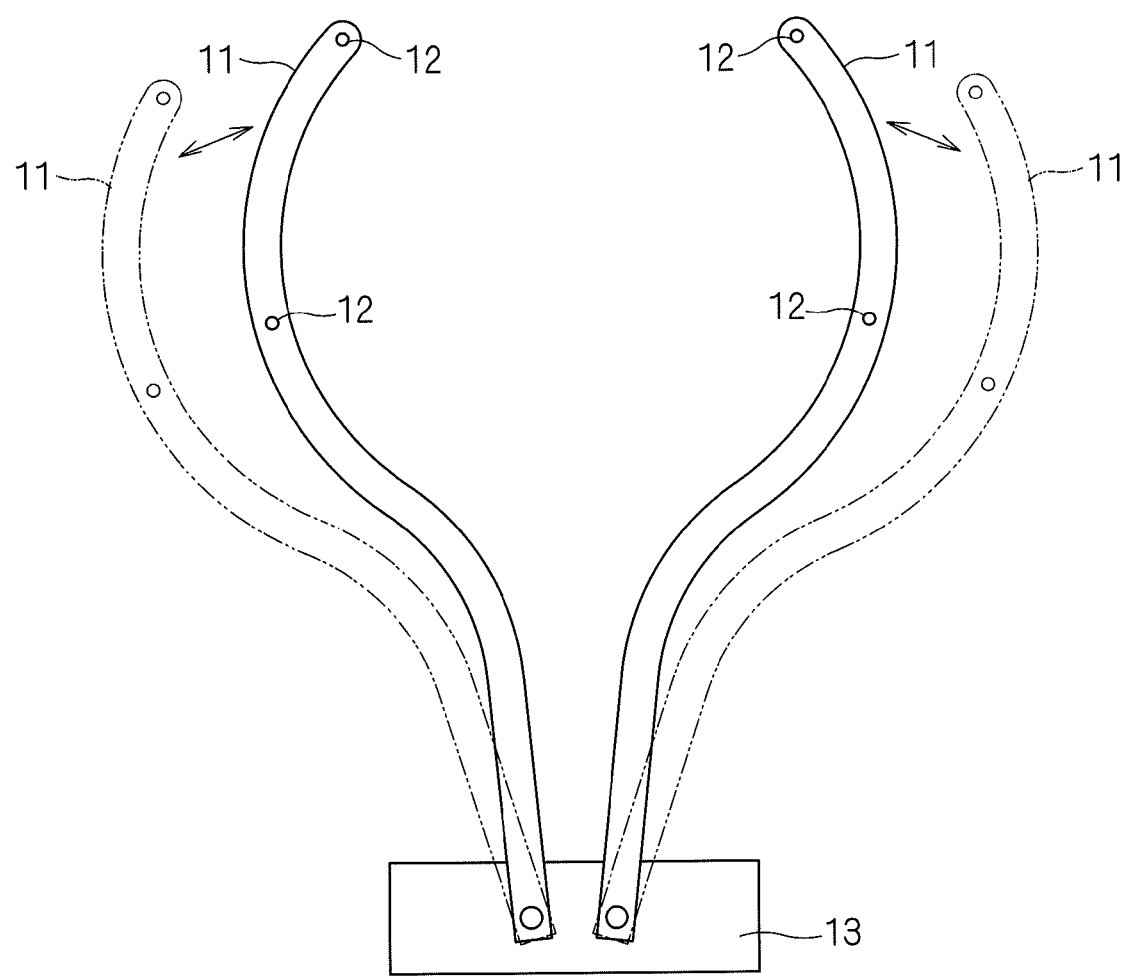
FIG. 5 is a plan view of a transferring mechanism.
Figure 6:
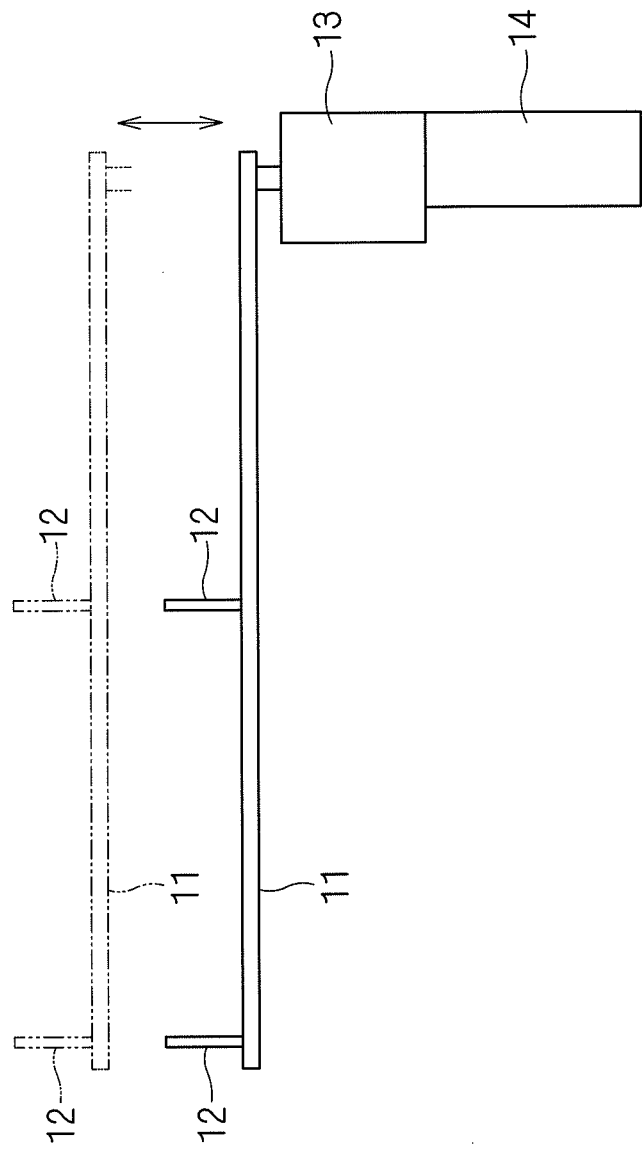
FIG. 6 is a side view of the transferring mechanism.

FIG. 5 is a plan view of the transferring mechanism 10. FIG. 6 is a side view of the transferring mechanism 10. The transferring mechanism 10 includes two moving/placing arms 11. The moving/placing arms 11 form a circular arc shape so as to follow the recess 62 having a generally circular ring shape. Each of the moving/placing arms 11 has two lift pins 12 standing thereon. Each of the moving/placing arms 11 is rotatable by means of a horizontal moving mechanism 13. The horizontal moving mechanism 13 horizontally moves a pair of the moving/placing arms 11 between a moving/placing operation position (as illustrated with the solid lines in FIG. 5) and a retracted position (as illustrated with the alternate long and two short dashes lines in FIG. 5). In the moving/placing operation position, the moving/placing arms 11 moves and places the semiconductor wafer W relative to the holder 7. In the retracted position, the moving/placing arms 11 do, in a plan view, not overlap the semiconductor wafer W held on the holder 7. The horizontal moving mechanism 13 may rotate each of the moving/placing arms 11 by separate motors, or alternatively may use a link mechanism so that the pair of moving/placing arms 11 can be rotated in conjunction with each other by a single motor.

The pair of moving/placing arms 11 are, together with the horizontal moving mechanism 13, moved up and down by an elevator mechanism 14. When the elevator mechanism 14 moves up the pair of moving/placing arms 11 in the moving/placing operation position, the total of four lift pins 12 pass through through holes 79 (see FIGS. 2 and 3) formed in the holding plate 74, and upper ends of the lift pins 12 protrude from the upper surface of the holding plate 74. When the elevator mechanism 14 moves down the pair of moving/placing arms 11 in the moving/placing operation position so that the lift pins 12 are pulled out of the through holes 79 and then the horizontal moving mechanism 13 moves the pair of moving/placing arms 11 so as to open them, the moving/placing arms 11 are brought into the retracted position. The retracted position of the pair of moving/placing arms 11 is located immediately above the ring portion 71 of the susceptor 70. Since the ring portion 71 is placed on the bottom surface of the recess 62, the retracted position of the moving/placing arms 11 is located inside the recess 62. A discharge mechanism (not shown) is also provided near an area where a driving part (the horizontal moving mechanism 13 and the elevator mechanism 14) of the transferring mechanism 10 is located, so that an atmosphere around the driving part of the transferring mechanism 10 can be discharged to the outside of the chamber 6.

Referring to FIG. 1 again, the flash heating part 5 provided above the chamber 6 has a light source and a reflector 52 provided within a housing 51. The light source includes a plurality of xenon flash lamps FL (in this preferred embodiment, 30 xenon flash lamps FL). The reflector 52 is provided so as to cover an upper part of the light source. A lamp light emission window 53 is mounted in the bottom of the housing 51 of the flash heating part 5. The lamp light emission window 53 defining a floor of the flash heating part 5 is a plate-like quartz window made of quartz. Since the flash heating part 5 is installed above the chamber 6, the lamp light emission window 53 is opposed to the upper chamber window 63. The flash lamps FL emit flashing lights to the heat treatment space 65 from the upper side of the chamber 6 through the lamp light emission window 53 and the upper chamber window 63.

Each of the plurality of flash lamps FL is an elongated lamp having a cylindrical rod shape. The plurality of flash lamps FL are arranged over a plane such that the longitudinal directions thereof can be parallel with one another along a main surface of the semiconductor wafer W held on the holder 7 (that is, along the horizontal direction). Therefore, a plane defined by the arrangement of the flash lamps FL is also a horizontal plane.

Figure 9:
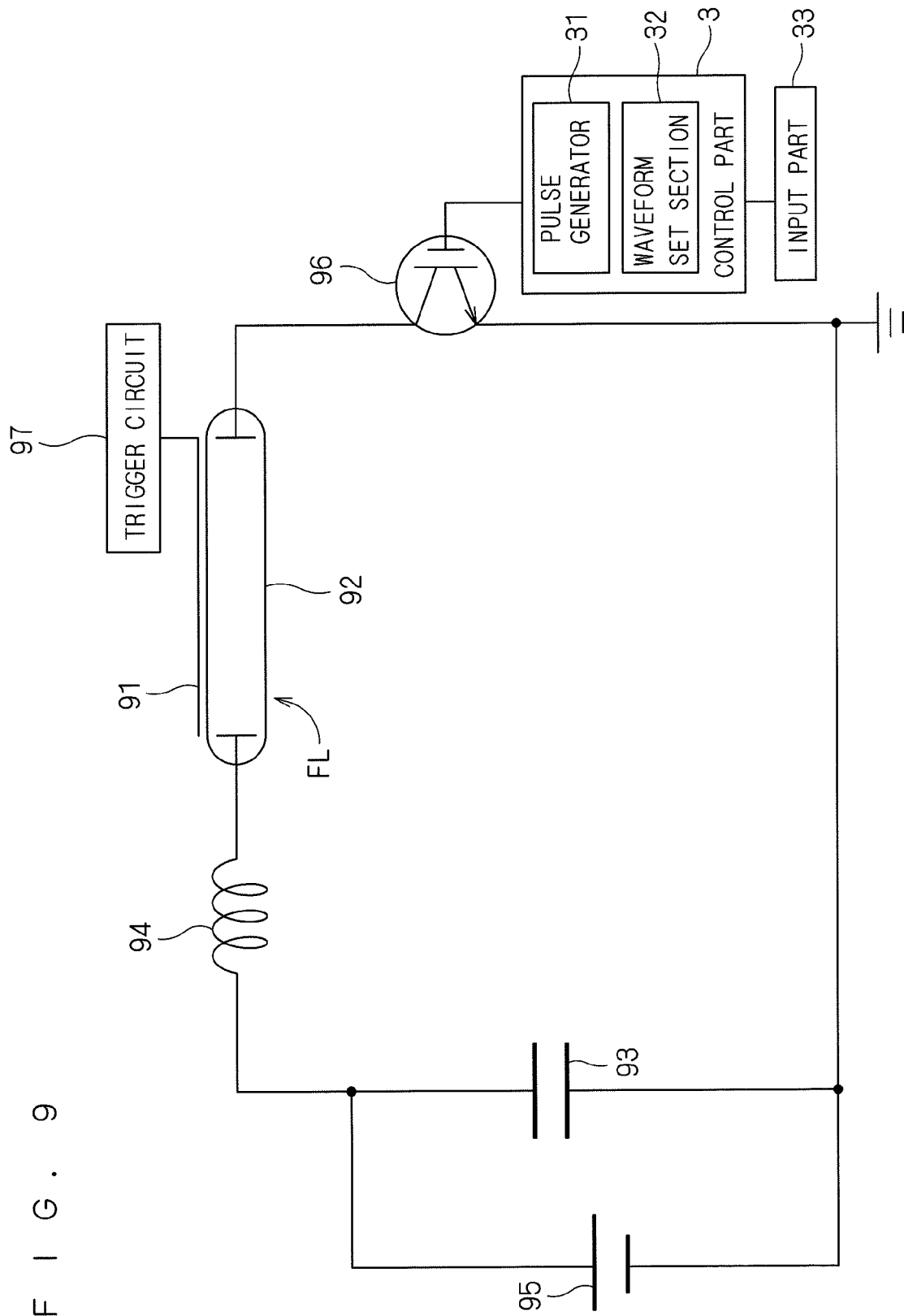
FIG. 9 is a diagram showing a drive circuit of a flash lamp.

FIG. 9 is a diagram showing a drive circuit of the flash lamp FL. As shown in FIG. 9, a capacitor 93, a coil 94, a flash lamp FL, and a swithing element 96 are connected in series. The flash lamp FL includes a rod-shaped glass tube (discharge tube) 92 and a trigger electrode 91. A xenon gas is sealed within the glass tube 92, and an anode and a cathode are arranged at both end portions of the glass tube 92. The trigger electrode 91 is attached to an outer circumferential surface of the glass tube 92. A power unit 95 applies a predetermined voltage, and the capacitor 93 is charged in accordance with the applied voltage. A trigger circuit 97 can apply a voltage to the trigger electrode 91. A timing at which the trigger circuit 97 applies a voltage to the trigger electrode 91 is controlled by the control part 3.

In this preferred embodiment, an insulated gate bipolar transistor (IGBT) is adopted as the swithing element 96. The IGBT is a bipolar transistor having a MOSFET (Metal Oxide Semiconductor Field Effect Transistor) incorporated in the gate thereof, and is a swithing element suitable for handling a large amount of power. A pulse generator 31 of the control part 3 applies a pulse signal to the gate of the swithing element 96.

Even when a pulse is outputted to the gate of the swithing element 96 while the capacitor 93 is charged so that a high voltage is applied across both electrodes of the glass tube 92, no electricity flows through the glass tube 92 in a normal state because the xenon gas is electrically insulating. However, if the trigger circuit 97 applies a voltage to the trigger electrode 91 to cause an insulation breakdown, an electrical discharge between both electrodes makes a current instantaneously flow through the glass tube 92. Excitation of atoms or molecules of xenon occurring at that time causes a light emission.

In FIG. 1, the reflector 52 is provided above the plurality of flash lamps FL so as to cover the whole of the flash lamps FL. A basic function of the reflector 52 is to reflect lights emitted from the plurality of flash lamps FL toward the holder 7. The reflector 52 is formed of an aluminum alloy plate, and a surface thereof (the surface facing the flash lamps FL) is roughened by a blast process and thus textured.

Figure 7:
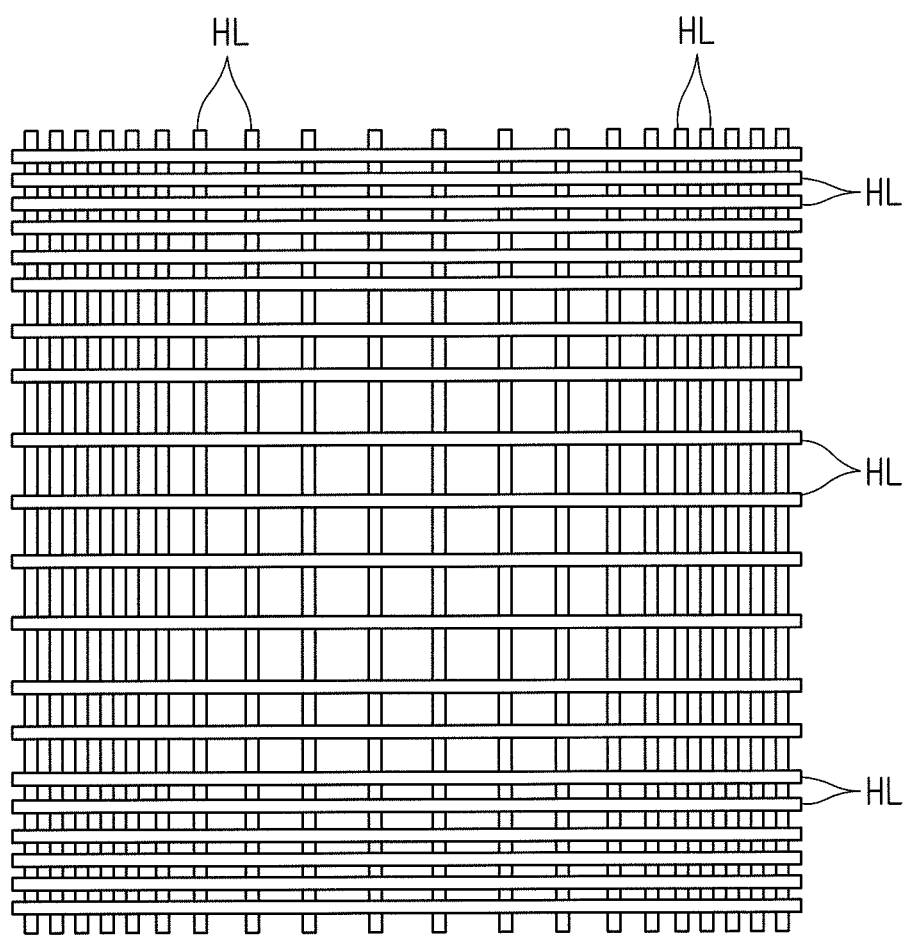
FIG. 7 is a plan view showing an arrangement of a plurality of halogen lamps.

A plurality of halogen lamps HL (in this preferred embodiment, 40 halogen lamps HL) are built in the halogen heating part 4 provided below the chamber 6. The plurality of halogen lamps HL emit lights to the heat treatment space 65 from the lower side of the chamber 6 through the lower chamber window 64. FIG. 7 is a plan view showing an arrangement of the plurality of halogen lamps HL. In this preferred embodiment, there are two levels of halogen lamps HL. In each of the upper and lower levels, 20 halogen lamps HL are arranged. Each of the halogen lamps HL is an elongated lamp having a cylindrical rod shape. In each of the upper and lower levels, the 20 halogen lamps HL are arranged such that the longitudinal directions thereof can be parallel with one another along the main surface of the semiconductor wafer W held on the holder 7 (that is, along the horizontal direction). Therefore, a plane defined by the arrangement of the halogen lamps HL in each of the upper and lower levels is a horizontal plane.

As shown in FIG. 7, in both of the upper and lower levels, the density of the arranged halogen lamps HL is higher in a region opposed to a peripheral portion of the semiconductor wafer W held on the holder 7 than in a region opposed to a central portion of the semiconductor wafer W. In other words, in both of the upper and lower levels of the lamp arrangements, the halogen lamps HL are arranged with shorter pitches in an end portion than in a central portion. This enables a larger amount of lights to be emitted to the peripheral portion of the semiconductor wafer W where a temperature drop is likely to occur during heating performed by light emission from the halogen heating part 4.

A group of lamps including the upper level of the halogen lamps HL and a group of lamps including the lower level of the halogen lamps HL are arranged so as to cross each other to form a grid pattern. In other words, the total 40 halogen lamps HL are arranged such that the longitudinal direction of the halogen lamps HL in the upper level can be perpendicular to the longitudinal direction of the halogen lamps HL in the lower level.

The halogen lamp HL is a filament type light source in which a filament arranged within a glass tube is electrically conducted and thereby caused to glow so that a light is emitted. A gas obtained by introducing a very small amount of a halogen element (such as iodine and bromine) into an inert gas such as a nitrogen gas and an argon gas is sealed within the glass tube. The introduction of the halogen element enables the temperature of the filament to be set to a high temperature while suppressing a break damage to the filament. Accordingly, the halogen lamp HL has such characteristics that it has a longer lifetime than a normal incandescent lamp and can continuously emits a high-intensity light. Additionally, since the halogen lamp HL is a rod-shaped lamp, the halogen lamp HL has a long lifetime, and arranging the halogen lamp HL along the horizontal direction allows an excellent efficiency of emission to the semiconductor wafer W provided above it.

As shown in FIG. 1, the heat treatment apparatus 1 has a shutter mechanism 2 provided at a side of the halogen heating part 4 and the chamber 6. The shutter mechanism 2 includes a shutter plate 21 and a slide drive mechanism 22. The shutter plate 21 is a plate not transparent to a halogen light, and made of titanium (Ti) for example. The slide drive mechanism 22 slidably moves the shutter plate 21 along the horizontal direction to bring the shutter plate 21 into or out of a light blocking position located between the halogen heating part 4 and the holder 7. If the slide drive mechanism 22 moves the shutter plate 21 forward, the shutter plate 21 is inserted to the light blocking position (as illustrated with the alternate long and two short dashes line in FIG. 1) located between the chamber 6 and the halogen heating part 4, to cause an interrupt between the lower chamber window 64 and the plurality of halogen lamps HL. This block the lights emitted from the plurality of halogen lamps HL toward the holder 7 of the heat treatment space 65. On the other hand, if the slide drive mechanism 22 retracts the shutter plate 21, the shutter plate 21 is brought out of the light blocking position located between the chamber 6 and the halogen heating part 4, so that the lower side of the lower chamber window 64 is opened.

The control part 3 controls the above-described various operation mechanisms provided in the heat treatment apparatus 1. The hardware configuration of the control part 3 is identical to that of an ordinary computer. The control part 3 includes a CPU for performing various types of computation, a ROM which is a read only memory storing a basic program, a RAM which is a random access memory storing various types of information, and a magnetic disk storing control software and data. As shown in FIG. 9, the control part 3 includes the pulse generator 31 and a waveform set section 32, and is connected to an input part 33. Various known input devices such as a keyboard, a mouse, and a touch panel are adoptable as the input part 33. The waveform set section 32 sets a pulse signal waveform based on an input made from the input part 33, and the pulse generator 31 generates a pulse signal in accordance with the waveform. The control part 3, the trigger circuit 97, and the swithing element 96 form light-emission control part for controlling light emission of the flash lamp FL. The control part 3 also controls light emission of the halogen lamp HL.

In addition to the above-described component parts, the heat treatment apparatus 1 includes various cooling configurations in order to prevent an excessive temperature rise in the halogen heating part 4, the flash heating part 5, and the chamber 6 which may be caused by thermal energy generated by the halogen lamps HL and the flash lamps FL during the heat treatment performed on the semiconductor wafer W. For example, a water cooling tube (not shown) is provided in a wall body of the chamber 6. Moreover, the halogen heating part 4 and the flash heating part 5 have an air cooling structure in which a gas flow is caused to exhaust heat. Furthermore, air is also supplied to a gap between the upper chamber window 63 and the lamp light emission window 53, to cool the flash heating part 5 and the upper chamber window 63.

Next, process steps in processing the semiconductor wafer W in the heat treatment apparatus 1 will be described. The semiconductor wafer W to be processed here is a semiconductor substrate to which impurity (ion) is added using an ion implantation method. FIG. 10 is a diagram showing a structure of an element formed on the semiconductor wafer W to be processed by the heat treatment apparatus 1. A source/drain region 112 and an extension region 113 are formed in the silicon substrate 111, and a gate electrode 115 is provided on an upper surface of the silicon substrate 111. The extension region 113 is a portion for electrically connecting the source/drain region 112 to a channel. The metal gate electrode 115 is provided on the silicon substrate 111 with interposition of the gate insulating film 114, and a ceramic side wall 116 is formed at a lateral side of the metal gate electrode 115. Impurity is introduced in the source/drain region 112 and the extension region 113 by an ion implantation method, and the impurity is activated by a light-emission heat treatment (annealing) performed by the heat treatment apparatus 1. The control part 3 controls the operation mechanisms of the heat treatment apparatus 1, and thereby the following process steps of the heat treatment apparatus 1 advance.

Firstly, the valve 84 for an air supply is opened, and the valves 89 and 192 for exhaust are opened, to start the supply and discharge of air to and from the chamber 6. When the valve 84 is opened, the nitrogen gas is supplied through the gas supply port 81 into the heat treatment space 65. When the valve 89 is opened, a gas existing in the chamber 6 is discharged from the gas discharge port 86. As a result, the nitrogen gas supplied from an upper portion of the heat treatment space 65 of the chamber 6 flows downward, and is discharged from a lower portion of the heat treatment space 65.

Additionally, since the valve 192 is opened, the gas existing in the chamber 6 is also discharged through the transport opening portion 66. Moreover, the atmosphere around the driving part of the transferring mechanism 10 is also discharged by a discharge mechanism (not shown). During the heat treatment performed on the semiconductor wafer W in the heat treatment apparatus 1, the nitrogen gas is continuously supplied to the heat treatment space 65, and the amount of the supply is appropriately changed in accordance with the process steps.

Then, the gate valve 185 is opened to open the transport opening portion 66, and a transport robot provided in the outside of the apparatus brings the ion-implanted semiconductor wafer W into the heat treatment space 65 of the chamber 6 through the transport opening portion 66. The semiconductor wafer W brought in by the transport robot moves to a position immediately above the holder 7, and stops. Then, the pair of moving/placing arms 11 of the transferring mechanism 10 are moved horizontally from the retracted position to the moving/placing operation position, and moved up. Thereby, the lift pins 12 pass through the through holes 79 and protrude from the upper surface of the holding plate 74, to receive the semiconductor wafer W.

After the semiconductor wafer W is placed on the lift pins 12, the transport robot exits from the heat treatment space 65, and the gate valve 185 closes the transport opening portion 66. Then, the pair of moving/placing arms 11 are moved down, so that the semiconductor wafer W is transferred from the transferring mechanism 10 to the holding plate 74 of the holder 7 and held in a horizontal position. FIG. 8 is a diagram showing the holding plate 74 having the semiconductor wafer W held thereon. The semiconductor wafer W is supported in point contact by the six bumps 75, and held at a distance (in this preferred embodiment, 1 mm) of 0.5 mm or more and 3 mm or less from the upper surface of the holding plate 74. Consequently, a gas layer having a thickness of 1 mm is interposed between the lower surface of the semiconductor wafer W and the upper surface of the holding plate 74. The pair of moving/placing arms 11 moved down to a position below the holding plate 74 is then retracted to the retracted position, that is, retracted to a position inside the recess 62, by the horizontal moving mechanism 13.

After the semiconductor wafer W is placed and held on the holding plate 74 of the holder 7, the 40 halogen lamps HL of the halogen heating part 4 are simultaneously turned on. Halogen lights emitted from the halogen lamps HL pass through the lower chamber window 64 and the holding plate 74 both made of quartz, and a back surface of the semiconductor wafer W is irradiated. Reception of the light emission from the halogen lamps HL raises the temperature of the semiconductor wafer W. Since the moving/placing arms 11 of the transferring mechanism 10 are retracted to the position inside the recess 62, they do not interrupt the heating performed by the halogen lamps HL.

Figure 11:
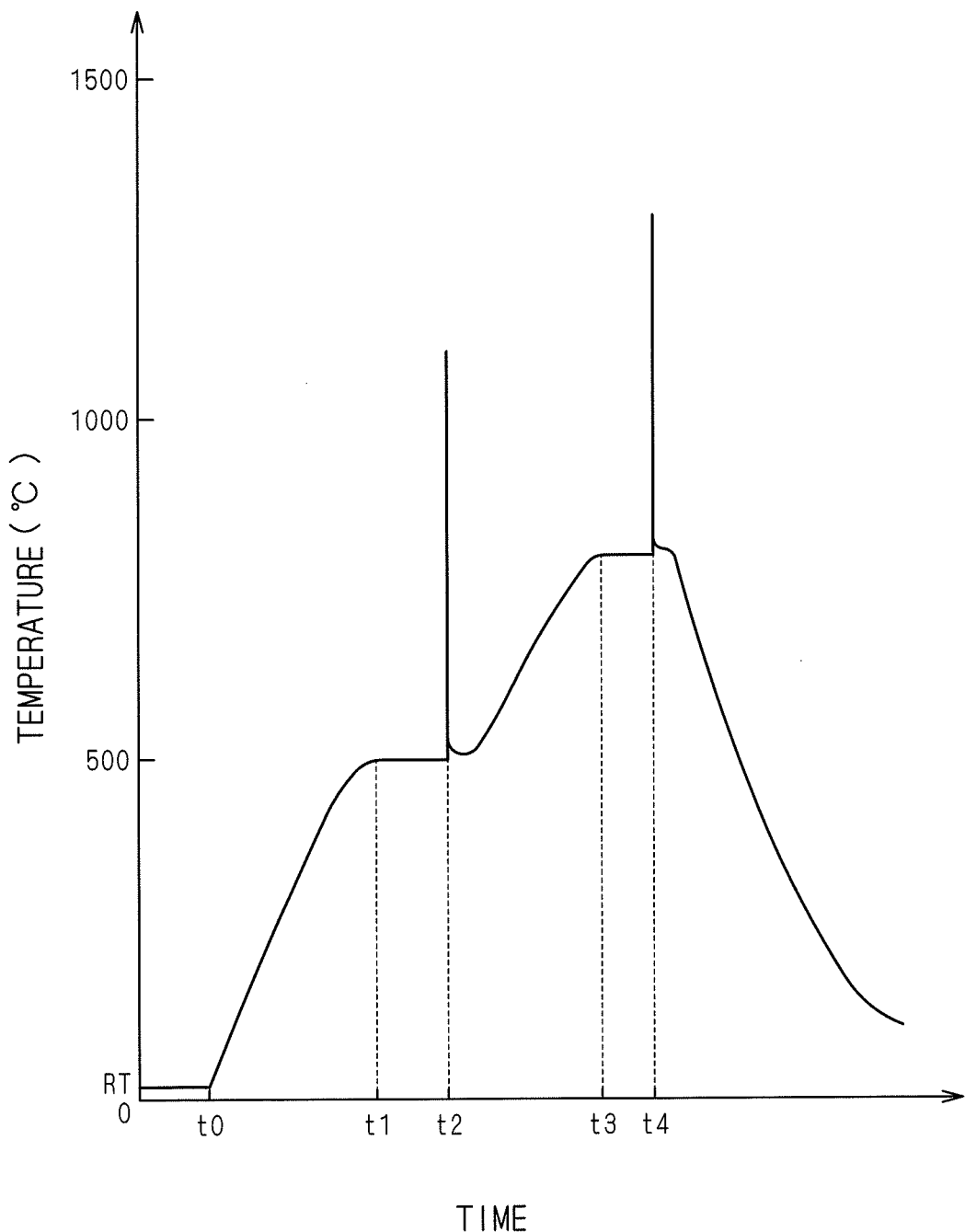
FIG. 11 is a diagram showing an exemplary change in the temperature of a surface of the semiconductor wafer.

FIG. 11 is a diagram showing a change in the temperature of the surface of the semiconductor wafer W. After the semiconductor wafer W is brought in and placed on the holding plate 74, the 40 halogen lamps HL are turned on at a time point t0, so that the temperature of the semiconductor wafer W is raised. The temperature of the semiconductor wafer W is measured by the contact-type thermometer 130 and the radiation thermometer 120. The temperature of the semiconductor wafer W measured by these thermometers is transmitted to the control part 3.

In the first preferred embodiment, by the light emission from the halogen lamps HL, the temperature of the semiconductor wafer W is once raised to a first preheating temperature (which in this preferred embodiment is 500 degrees C.) equal to or lower than 650 degrees C., and the temperature of the semiconductor wafer W is maintained at the first preheating temperature. Then, a first flash heating is performed in which first flashing lights are emitted from the flash lamps FL to the semiconductor wafer W maintained at the first preheating temperature. Details of the flash heating will be described later.

Then, after the first flash heating is completed, the control part 3 increases the output of the halogen lamps HL again, to further raise the temperature of the semiconductor wafer W to a second preheating temperature (which in this preferred embodiment is 800 degrees C.) equal to or higher than 700 degrees C., and the temperature of the semiconductor wafer W is maintained at the second preheating temperature. Then, a second flash heating is performed in which second flashing lights are emitted from the flash lamps FL to the semiconductor wafer W maintained at the second preheating temperature.

In this manner, in the first preferred embodiment, a two-staged flash heating is performed including the first flash heating in which the first flashing lights are emitted from the flash lamps FL to the semiconductor wafer W having been heated to the first preheating temperature equal to or lower than 650 degrees C. by the halogen lamps HL, and the subsequent second flash heating in which the second flashing lights are emitted from the flash lamps FL to the semiconductor wafer W having been heated to the second preheating temperature equal to or higher than 700 degrees C. by the halogen lamps HL. Hereinafter, the two-staged flash heating will be described in detail.

Firstly, at the time point t0, the control part 3 turns on the 40 halogen lamps HL to raise the temperature of the semiconductor wafer W to the first preheating temperature (500 degrees C.), and maintains the semiconductor wafer W at the first preheating temperature for a while. To be more specific, at a time point t1 where the temperature of the semiconductor wafer W, which is measured by the contact-type thermometer 130 and the radiation thermometer 120, reaches 500 degrees C., the control part 3 controls the halogen lamps HL to maintain the temperature of the semiconductor wafer W at approximately 500 degrees C. A time period from the time point t1 where the temperature of the semiconductor wafer W reaches the first preheating temperature to a time point t2 where the flash lamps FL emit lights is at least two seconds. That is, in a time period of at least two seconds immediately before the flash lamps FL emit the flashing lights for the first flash heating, the preheating prior to the first flash heating is being performed in which the temperature of the semiconductor wafer W is maintained constant at the first preheating temperature by the light emission from the halogen lamps HL.

Performing the preheating for at least two seconds by the halogen lamps HL in this manner enables the temperature of the entire semiconductor wafer W to be uniformaly raised to the first preheating temperature. This improves the uniformity of a temperature distribution in a plane. In the preheating stage using the halogen lamp HL, the temperature of the peripheral portion of the semiconductor wafer W tends to be lower than the temperature of the central portion thereof, because heat dissipation is more likely to occur in the peripheral portion. However, in the halogen heating part 4, the halogen lamps HL are arranged at a higher density in the region opposed to the peripheral portion of the semiconductor wafer W than in the region opposed to the central portion of the semiconductor wafer W. Therefore, an increased amount of light is emitted to the peripheral portion of the semiconductor wafer W in which heat dissipation is more likely to occur. This can increase the uniformity of the temperature distribution in a plane of the semiconductor wafer W in the preheating stage. Moreover, since the inner circumferential surface of the reflective ring 69 mounted on the chamber side portion 61 is a mirror surface, the amount of light reflected to the peripheral portion of the semiconductor wafer W is increased due to the inner circumferential surface of the reflective ring 69. This can futhermore increase the uniformity of the temperature distribution in a plane of the semiconductor wafer W in the preheating stage. In a relative low temperature region of 650 degrees C. or lower, the phenomenon of diffusion and activation of the impurity hardly occurs.

At a time point t2 coming at least two seconds after the temperature of the semiconductor wafer W reaches the first preheating temperature, the flash lamps FL emit the first flashing lights. For the emission of the flashing lights by the flash lamps FL, the power unit 95 preliminarily stores charges in the capacitor 93. Then, in a state where the charges are stored in the capacitor 93, the pulse generator 31 of the control part 3 outputs the pulse signal to the swithing element 96.

Figure 12:
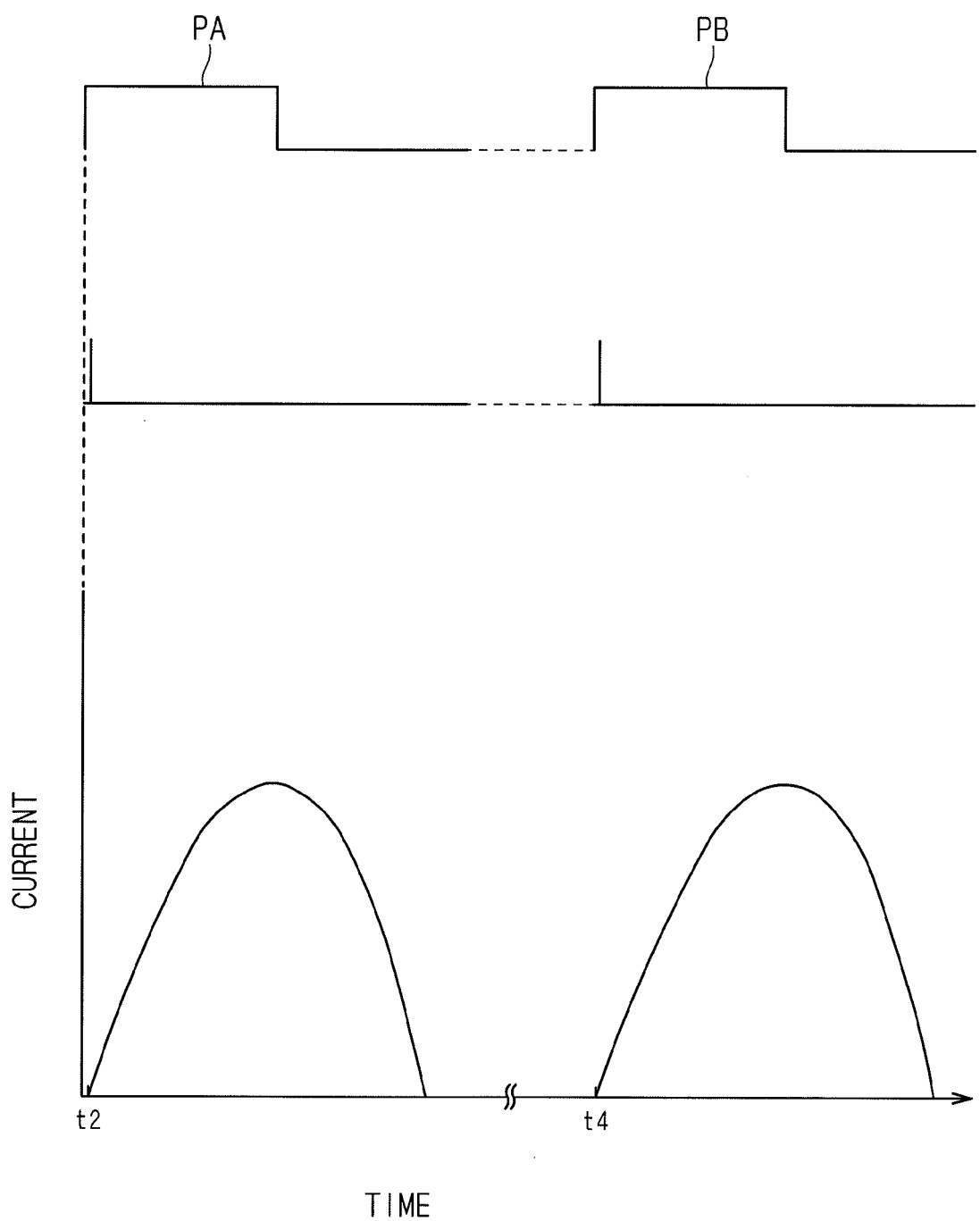
FIG. 12 is a diagram showing an example of the correlation between a waveform of a pulse signal and a current flowing in a circuit.

FIG. 12 is a diagram showing an example of the correlation between the waveform of the pulse signal and the current flowing in the circuit. In FIG. 12, the upper part indicates the waveform of the pulse signal outputted from the pulse generator 31, the middle part indicates a timing for applying a voltage to the trigger electrode 91, and the lower part indicates the waveform of the current flowing in the circuit including the flash lamp FL. Here, the pulse signal having the waveform as indicated by the upper part of FIG. 12 is outputted from the pulse generator 31. The waveform of the pulse signal can be defined by inputting, from the input part 33, a recipe that sequentially sets a pulse width time (ON time) and a pulse interval time (OFF time). An operator inputs such a recipe from the input part 33 to the control part 3, and thus the waveform set section 32 of the control part 3 sets the pulse waveform as indicated by the upper part of FIG. 12 based on the recipe. In the pulse waveform indicated by the upper part of FIG. 12, a single pulse PA corresponding to the emission of the first flashing light is set and a single pulse PB corresponding to the emission of the second flashing light is set. The pulse generator 31 outputs the pulse signal in accordance with the pulse waveform set by the waveform set section 32. As a result, the pulse signal having the waveform as indicated by the upper part of FIG. 12 is applied to the gate of the swithing element 96, so that ON/OFF drive operations of the swithing element 96 are controlled. More specifically, when the pulse signal inputted to the gate of the swithing element 96 is ON, the swithing element 96 is brought into an ON state, while when the pulse signal is OFF, the swithing element 96 is brought into an OFF state.

As indicated by the middle part of FIG. 12, the control part 3 controls the trigger circuit 97 to apply a trigger voltage to the trigger electrode 91 in synchronization with a timing at which the pulse signal outputted from the pulse generator 31 is brought into ON. If the initial pulse PA is inputted to the gate of the swithing element 96 while the charges are stored in the capacitor 93 and in synchronization therewith, a high voltage is applied to the trigger electrode 91, a current starts to flow between both electrodes in the glass tube 92 of the flash lamp FL. The excitation of atoms or molecules of xenon occurring at that time causes a light emission, so that the flash lamp FL emits the first flashing light at the time point t2. Then, when the pulse PA is set to OFF, a value of the current flowing in the glass tube 92 of the flash lamp FL decreases, and the flash lamp FL is completely turned off once. Then, if the latter pulse PB is inputted to the gate of the swithing element 96 and in synchronization therewith, a high voltage is applied to the trigger electrode 91, a current starts to flow between both electrodes of the glass tube 92 again. At a time point t4, the flash lamp FL emits the second flashing light. Consequently, a current having the waveform as indicated by the lower part of FIG. 12 flows in the flash lamp FL. Thus, the flash lamp FL emits a light twice.

The light-emission output of the flash lamp FL is substantially proportional to the current flowing in the flash lamp FL. Accordingly, an output waveform (profile) of the light-emission output of the flash lamp FL has a pattern similar to that of the current waveform indicated by the lower part of FIG. 12. With the output waveform of the flash lamp FL similar to that indicated by the lower part of FIG. 12, the flashing light is emitted to the semiconductor wafer W placed on the holding plate 74 of the holder 7.

Although an emission time period in which the flash lamp FL emits the first flashing light and the second flashing light depends on the lengths of the pulses PA and PB, the emission time period is a maximum of 500 milliseconds, which is significantly shorter than the time period of the preheating performed by the halogen lamp HL. Emission of the intense flashing light from the flash lamp FL for this very short time period causes an instantaneous and rapid rise in the temperature of the surface of the semiconductor wafer W, as shown in FIG. 11.

In the first flash heating, the flash lamp FL emits the first flashing light to the semiconductor wafer W having been heated to the first preheating temperature (500 degrees C.) by the halogen lamp HL, to make the temperature of the surface of the semiconductor wafer W reach 1000 degrees C. or higher (in this preferred embodiment, 1100 degrees C.). Through this first flash heating, a surface layer of the silicon substrate 111 amorphized in the ion implantation recovers a crystal structure. As a result, in the subsequent second flash heating, diffusion of the impurity can be suppressed. In the first flash heating, the preheating temperature (first preheating temperature) for preheating the semiconductor wafer W is 650 degrees C., and a time period in which the surface of the semiconductor wafer W has a high temperature equal to or higher than 1000 degrees C. is very short. Thus, no diffusion of the impurity occurs.

After the emission of the first flashing light is completed, the temperature of the surface of the semiconductor wafer W rapidly drops, and the temperature of the entire semiconductor wafer W also returns approximately to the first preheating temperature. Then, the control part 3 increases the output of the halogen lamp HL to raise the temperature of the semiconductor wafer W to the second preheating temperature (800 degrees C.), and maintains the second preheating temperature for a while. More specifically, at the time point t3 at which the temperature of the semiconductor wafer W measured by the contact-type thermometer 130 and the radiation thermometer 120 reaches 800 degrees C., the control part 3 controls the halogen lamp HL to maintain the temperature of the semiconductor wafer W at approximately 800 degrees C. At this time, in the period from the first flash heating to the second flash heating, the rate of the temperature rise in the semiconductor wafer W caused by the halogen lamp HL is equal to or more than 10 degrees C. per second and equal to or less than 100 degrees C. per second. Therefore, a time interval from the first flash heating to the second flash heating (time interval from the time point t2 to the time point t4) is a few seconds to several tens of seconds. From the viewpoint of preventing diffusion of the impurity, it is preferable that this time interval is short, and accordingly it is preferable that the rate of the temperature rise caused by the halogen lamp HL in the time period from the first flash heating to the second flash heating is high. In such a case, the rate of the temperature rise caused by the halogen lamp HL may be equal to or more than 100 degrees C. per second.

Similarly to the above-described first flash heating, a time period from the time point t3 where the temperature of the semiconductor wafer W reaches the second preheating temperature to the time point t4 where the flash lamp FL emits a light is at least two seconds. That is, in a time period of at least two seconds immediately before the flash lamps FL emit the flashing lights for the second flash heating, the preheating prior to the second flash heating is being performed in which the temperature of the semiconductor wafer W is maintained constant at the second preheating temperature by the light emission from the halogen lamps HL.

Performing the preheating for at least two seconds by the halogen lamps HL in this manner enables the temperature of the entire semiconductor wafer W to be uniformaly raised to the second preheating temperature. This improves the uniformity of a temperature distribution in a plane. Moreover, due to the density of the arranged halogen lamps HL and the reflection from the reflective ring 69, an increased amount of light can be emitted to the peripheral portion of the semiconductor wafer W in which heat dissipation is likely to occur. This can furthermore increase the uniformity of the temperature distribution in a plane of the semiconductor wafer W. In a temperature range of 700 degrees C. or higher, there is a concern about diffusion of the impurity, but in this preferred embodiment, an amorphous state of the surface layer of the silicon substrate 111 is crystallized by the first flash heating and therefore diffusion of the impurity can be suppressed.

At the time point t4 coming at least two seconds after the temperature of the semiconductor wafer W reaches the second preheating temperature, the second flash heating is performed in which the flash lamps FL emit the second flashing lights. In the emission of the second flashing light, flashing light emission is performed in which the flash lamps FL emits lights with the current waveform indicated by the latter half of the lower part of FIG. 12, and an emission period thereof is 500 milliseconds or less.

In the second flash heating, the flash lamp FL emits the second flashing light to the semiconductor wafer W having been heated to the second preheating temperature (800 degrees C.) by the halogen lamp HL, to make the temperature of the surface of the semiconductor wafer W reach 1100 degrees C. or higher (in this preferred embodiment, 1300 degrees C.). Through this second flash heating, an activation process for activating the implanted impurity is performed. In addition, recovery from defects, such as EOR (End of Range) defects, left after the first flash heating is promoted.

Figure 13:
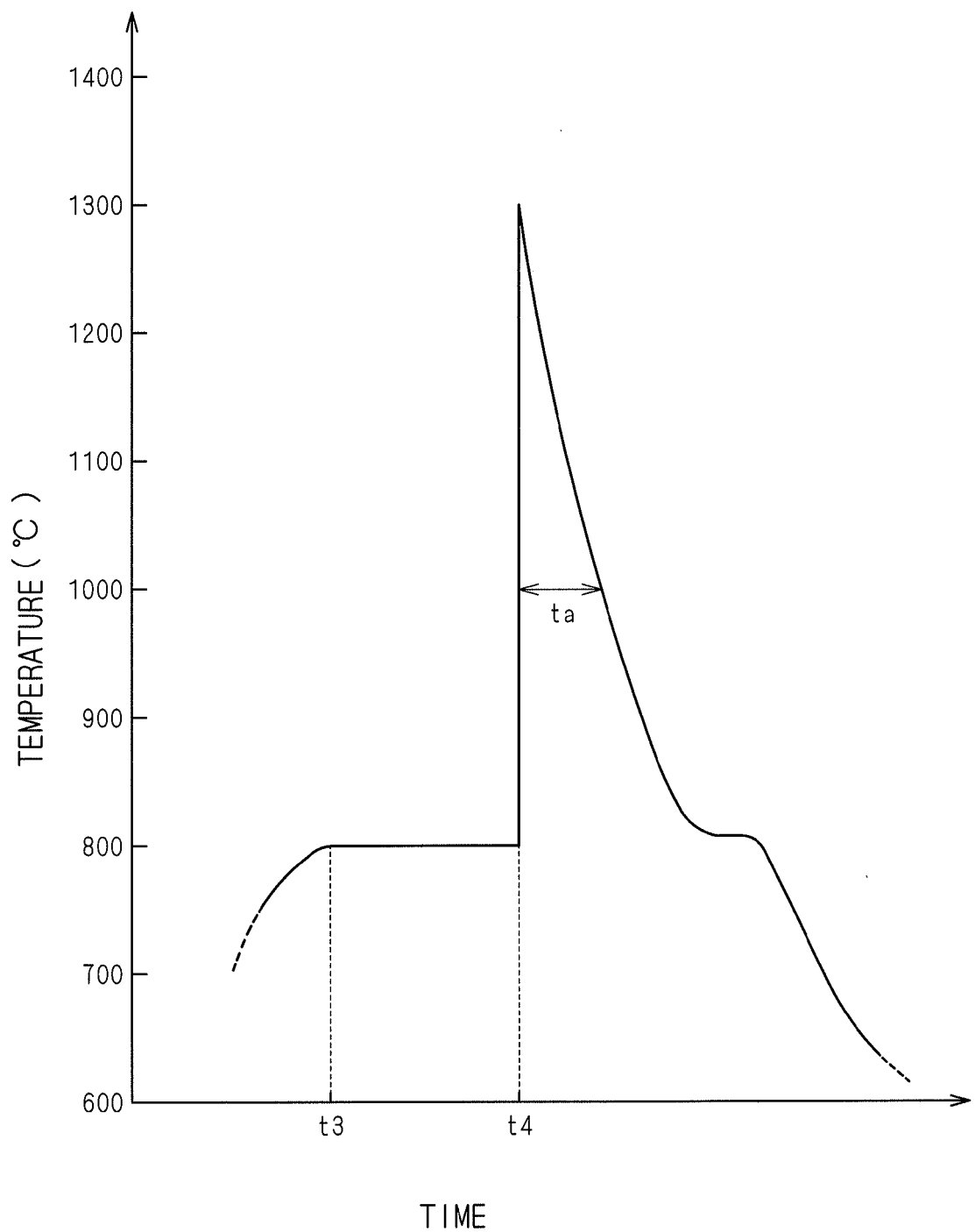
FIG. 13 is an enlarged view showing a second flash heating of FIG. 11.

FIG. 13 is an enlarged view of the second flash heating of FIG. 11. At the time point t4, the flash lamps FL emit the second flashing lights, and thereby the temperature of the surface of the semiconductor wafer W instantaneously reaches 1300 degrees C. When the emission of the second flashing lights is completed, the temperature of the surface of the semiconductor wafer W drops. Here, in this preferred embodiment, the semiconductor wafer W is supported in point contact by the six bumps 75 of the holding plate 74, and the gas layer having a thickness of approximately 1 mm is interposed between the lower surface of the semiconductor wafer W and the upper surface of the holding plate 74. Therefore, heat is hardly transferred from the lower surface of the semiconductor wafer W to the holding plate 74, and the rate of temperature drop in the surface of the semiconductor wafer W after the emission of the flashing lights is relatively slow.

If a heat transfer from the semiconductor wafer W to the holding plate 74 was sufficiently large, the temperature of the surface of the semiconductor wafer W having reached 1300 degrees C. as a result of the second flash heating would rapidly drop approximately to second preheating temperature. However, a heat transfer hardly occurs from the semiconductor wafer W supported in point contact to the holding plate 74, and therefore the rate of temperature drop in the surface of the semiconductor wafer W after the second flash heating is relatively low. Thus, a substantially triangular thermal history as shown in FIG. 13 can be obtained after the flash heating. Consequently, 20 milliseconds or more can be ensured as an annealing time period ta in which the temperature of the surface of the semiconductor wafer W after the emission of the second flashing lights is 1000 degrees C. or higher. Since the temperature of the surface of the semiconductor wafer W is maintained at 1000 degrees C. or higher for 20 milliseconds or more, the EOR defects left even after the first flash heating can be sufficiently recovered. Additionally, since the amorphous state of the surface layer of the silicon substrate 111 is crystallized by the first flash heating, the diffusion of the impurity is suppressed to the minimum. In FIG. 13, a temperature history of the wafer surface after the emission of the second flashing lights is shown exaggerated for ease of understanding. Actually, the annealing time period ta is significantly shorter than the preheating time period from the time point t2 to the time point t4.

After the second flash heating is completed, when a time period for causing a temperature drop in the surface of the semiconductor wafer W to around the second preheating temperature elapses, the halogen lamps HL are turned off. Thereby, the temperature of the semiconductor wafer W starts to drop from the second preheating temperature. Simultaneously with the turn off of the halogen lamps HL, the shutter mechanism 2 inserts the shutter plate 21 into the light blocking position located between the halogen heating part 4 and the chamber 6. After the turn off of the halogen lamps HL, the temperature of the filament and a tube wall does not immediately drop. The filament and the tube wall having a high temperature continue to emit a radiant heat for a while, which hinders the temperature drop in the semiconductor wafer W. The insertion of the shutter plate 21 blocks the radiant heat emitted from the turned-off halogen lamps HL to the heat treatment space 65. This can increase the rate of the temperature drop in the semiconductor wafer W.

After the temperature of the semiconductor wafer W drops to a predetermined temperature or lower, the pair of moving/placing arms 11 of the transferring mechanism 10, again, are moved horizontally from the retracted position to the moving/placing operation position, and moved up. Thereby, the lift pins 12 protrude from the upper surface of the holding plate 74, to receive the heat-treated semiconductor wafer W from the holding plate 74. Then, the transport opening portion 66 closed by the gate valve 185 is opened, and the semiconductor wafer W placed on the lift pins 12 is brought out by the transport robot provided in the outside of the apparatus. Thus, the heat treatment on the semiconductor wafer W in the heat treatment apparatus 1 is completed.

In this preferred embodiment, the first flash heating is performed in which the temperature of the surface of the semiconductor wafer W reaches 1000 degrees C. or higher by emitting the first flashing lights from the flash lamps FL to the semiconductor wafer W having been heated to the first preheating temperature equal to or lower than 650 degrees C. by the emission of lights from the halogen lamps HL, and then the semiconductor wafer W is further heated by the emission of lights from the halogen lamps HL and the second flash heating is performed by emitting the second flashing lights. Performing the first flash heating causes the crystallization of the surface layer of the silicon substrate 111 amorphized at the time of the ion implantation. This can suppress diffusion of the impurity in the subsequent second flash heating. In the second flash heating, the impurity is activated and the introduced crystal defects are recovered. Since the two-staged flash heating is performed in this preferred embodiment, recovery from the defects introduced at the time of the impurity implantation can be promoted while diffusion of the implanted impurity is suppressed, and additionally the impurity can be activated in a good manner.

In the second flash heating, the preheating temperature (second preheating temperature) is 700 degrees C. or higher, and the flash lamps FL emit the second flashing lights to make the temperature of the semiconductor wafer W reach 1100 degrees C. or higher. This can ensure that the impurity is activated and the defects are recovered.

In this preferred embodiment, in a time period of at least two seconds immediately before the flashing lights are emitted in each of the first flash heating and the second flash heating, the preheating is performed to maintain the temperature of the semiconductor wafer W constant by emitting lights from the halogen lamps HL. Therefore, the entire semiconductor wafer W can be uniformly preheated, thus improving the uniformity of the temperature distribution in a plane.

In this preferred embodiment, the two-staged flash heating including the first flash heating and the second flash heating is performed. The time interval from the first flash heating to the second flash heating is a few seconds to several tens of seconds (depending on the rate of the temperature rise caused by the halogen lamps HL from the first flash heating to the second flash heating and the time period in which the second preheating temperature is maintained). In a case where the flash lamp FL emits a light without using the swithing element 96 as conventional, the charge stored in the capacitor 93 is consumed in a single light emission (the emission of only the first flashing light), and one minute or more is required in order to recharge the capacitor 93 for the emission of the second flashing light. Therefore, it is difficult to perform the two-staged flash heating at a time interval of a few seconds to several tens of seconds. In this preferred embodiment, the light emission of the flash lamp FL can be once stopped by using the swithing element 96 of the IGBT. This enables the charge stored in the capacitor 93 to be divided into two parts and consumed. Thus, the two-staged flash heating can be achieved in which the flash lamp FL emits a light twice at a time interval of a few seconds to several tens of seconds to thereby perform the emission of the first flashing light and the emission of the second flashing light.

2. Second Preferred Embodiment

Next, a second preferred embodiment of the present invention will be described. A configuration of a heat treatment apparatus according to the second preferred embodiment is identical to that of the first preferred embodiment. The semiconductor wafer W to be processed is, similarly to the first preferred embodiment, a semiconductor substrate in which impurity is introduced into a source/drain region and an extension region by using an ion implantation method. Moreover, process steps in the heat treatment apparatus of the second preferred embodiment are generally identical to those of the first preferred embodiment. The second preferred embodiment is different from the first preferred embodiment, in terms of a pattern of the heat treatment on the semiconductor wafer W. Although the two-staged flash heating is performed in the first preferred embodiment, a three-staged flash heating is performed in the second preferred embodiment.

FIG. 14 is a diagram showing a change in the temperature of the surface of the semiconductor wafer W in the second preferred embodiment. In the second preferred embodiment, an additional flash heating is performed between the first flash heating and the second flash heating. To be more specific, firstly, at a time point t11, the first flash heating is performed in which the flash lamp FL emits the first flashing light to the semiconductor wafer W having been heated to the first preheating temperature equal to or lower than 650 degrees C. by the light emission from the halogen lamp HL, so that the temperature of the surface of the semiconductor wafer W reaches 1000 degrees C. or higher. Then, at a time point t12, the middle flash heating is performed in which the flash lamp FL emits a flashing light to the semiconductor wafer W having been further heated by the light emission from the halogen lamp HL. Finally, the final flash heating is performed in which, at a time point t13, the flash lamp FL emits the flashing light to the semiconductor wafer W having been further preheated to 700 degrees C. or higher by the light emission from the halogen lamp HL, so that the temperature of the surface of the semiconductor wafer W reaches 1100 degrees C. or higher. This final flash heating is performed under the same conditions as those of the second flash heating of the first preferred embodiment.

That is, as clearly seen from the comparison between FIG. 14 and FIG. 11, in the second preferred embodiment, the additional flash heating in which the flash lamp FL emits the flashing light to the semiconductor wafer W is performed between the first flash heating and the second flash heating of the first preferred embodiment. In order to achieve such a three-staged flashing light emission, three pulses are inputted to the gate of the swithing element 96 and the trigger voltage is applied to the trigger electrode 91 in synchronization with a timing at which the pulse signal is set to ON. Similarly to the first preferred embodiment, in a time period of at least two seconds immediately before the flashing light is emitted in each flash heating, the preheating may be performed in which the temperature of the semiconductor wafer W is maintained constant by the light emission from the halogen lamp HL.

Also in this three-staged flash heating, similarly to the first preferred embodiment, the surface layer of the silicon substrate 111 amorphized at the time of ion implantation is crystallized by the first flash heating, and therefore diffusion of the impurity can be suppressed in the subsequent additional flash heating and second flash heating. In the additional flash heating and the second flash heating, the impurity can be activated and the introduced crystal defects can be recovered. As a result, similarly to the first preferred embodiment, the recovery from the defects introduced at the time of the impurity implantation can be promoted while diffusion of the implanted impurity is suppressed, and additionally the impurity can be activated in a good manner. Moreover, the increase in the number of times the flash heating is performed allows a better activation of the impurity and also a promoted recovery from the crystal defects.

3. Third Preferred Embodiment

Next, a third preferred embodiment of the present invention will be described. A configuration of a heat treatment apparatus according to the third preferred embodiment is identical to that of the first preferred embodiment. The semiconductor wafer W to be processed is, similarly to the first preferred embodiment, a semiconductor substrate in which impurity is introduced into a source/drain region and an extension region by using an ion implantation method. Moreover, process steps in the heat treatment apparatus of the third preferred embodiment are generally identical to those of the first preferred embodiment. The third preferred embodiment is different from the first preferred embodiment, in terms of a pattern of the heat treatment on the semiconductor wafer W. In the third preferred embodiment, after the second flash heating is completed, the semiconductor wafer W is furthermore heated by the halogen lamps HL.

Figure 15:
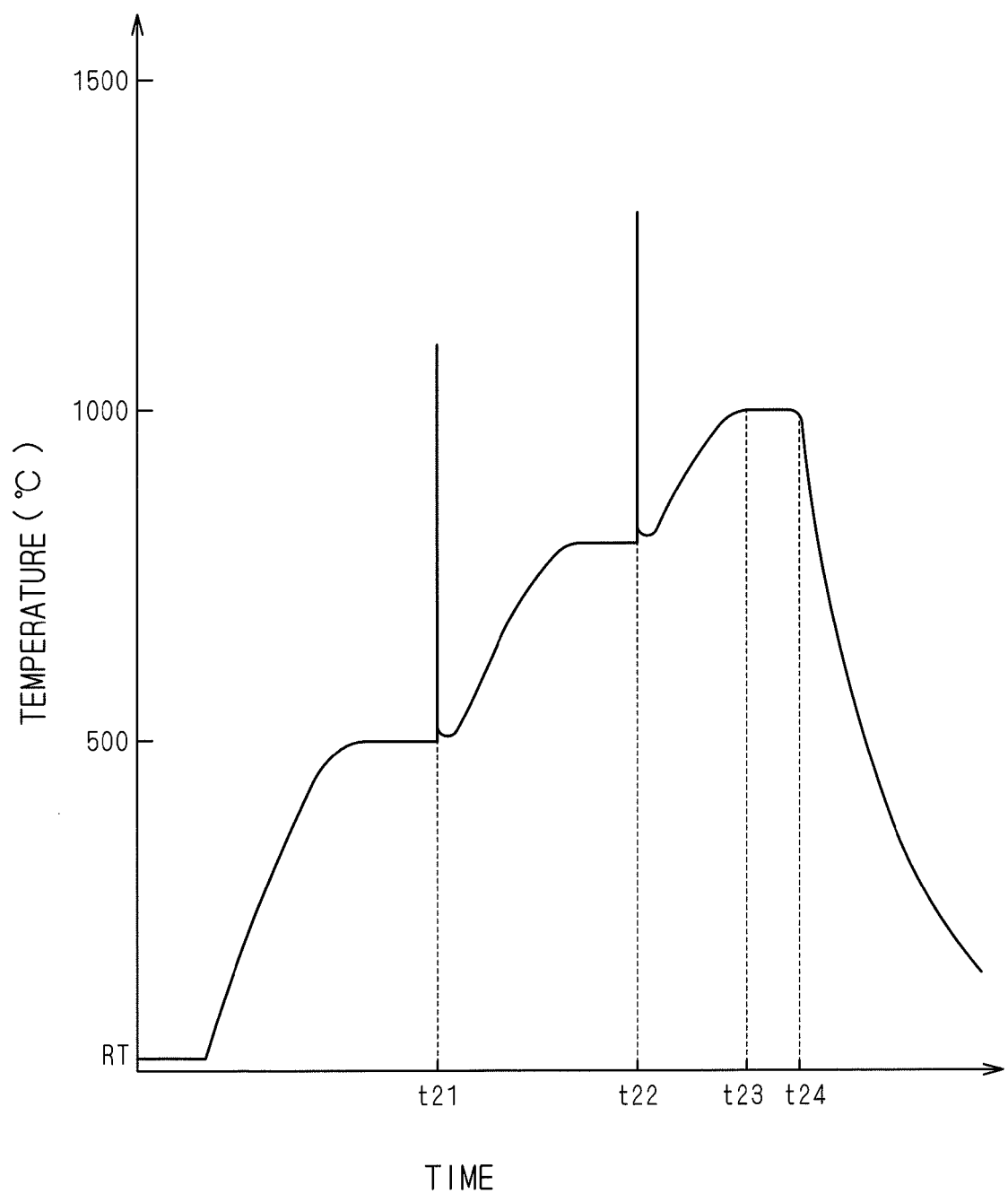
FIG. 15 is a diagram showing a change in the temperature of a surface of a semiconductor wafer according to a third preferred embodiment.

FIG. 15 is a diagram showing a change in the temperature of the surface of the semiconductor wafer W in the third preferred embodiment. Also in the third preferred embodiment, a two-staged flash heating is performed, which is identical to the first preferred embodiment. That is, firstly, at a time point t21, the first flash heating is performed in which the flash lamp FL emits the first flashing light to the semiconductor wafer W having been heated to the first preheating temperature equal to or lower than 650 degrees C. by the light emission from the halogen lamp HL, so that the temperature of the surface of the semiconductor wafer W reaches 1000 degrees C. or higher. Then, the second flash heating is performed in which, at a time point t22, the flash lamp FL emits the second flashing light to the semiconductor wafer W having been heated to the second preheating temperature equal to or higher than 700 degrees C. by the light emission from the halogen lamp HL, so that the temperature of the surface of the semiconductor wafer W reaches 1100 degrees C. or higher. In a time period of at least two seconds immediately before the flashing light is emitted in each of the first flash heating and the second flash heating, the preheating may be performed in which the temperature of the semiconductor wafer W is maintained constant by the light emission from the halogen lamp HL.

In the third preferred embodiment, after the emission of the second flashing light is completed, the semiconductor wafer W is furthermore heated by the light emission from the halogen lamp HL. Then, at a time point t23 at which the semiconductor wafer W reaches an annealing temperature equal to or higher than 1000 degrees C. which exceeds the second preheating temperature, the control part 3 controls the halogen lamps HL to maintain the semiconductor wafer W at the annealing temperature. In a time period from the time point t23 to a time point t24, the semiconductor wafer W is maintain at the annealing temperature. At the time point t24, the halogen lamps HL are turned off, and thus the temperature of the semiconductor wafer W quickly drops.

In the third preferred embodiment, after the second flash heating is completed, the semiconductor wafer W is furthermore heated to 1000 degrees C. or higher which exceeds the second preheating temperature by the light emission from the halogen lamps HL. This is the same as performing a spike annealing by using the halogen lamps HL after the two-staged flash heating similar to that of the first preferred embodiment. If the impurity is activated only by the spike annealing using the halogen lamps HL, the impurity is significantly diffused and it is difficult to achieve a shallow junction. On the other hand, the spike annealing using the halogen lamps HL is effective in the recovery of defects.

The third preferred embodiment combines the advantage of a halogen lamp annealing that is effective in the recovery of defects with the advantage of a flash lamp annealing that the activation can be performed while suppressing diffusion of the impurity. Thus, the two-staged flash heating similar to that of the first preferred embodiment is performed to thereby suppress the diffusion of the implanted impurity while activating the impurity in a good manner. Additionally, since the surface layer of the silicon substrate 111 amorphized at the time of the ion implantation is crystallized by the first flash heating, the diffusion of the impurity can be suppressed even if the semiconductor wafer W is heated to a high temperature equal to or higher than 1000 degrees C. by the light emission from the halogen lamps HL. Heating the semiconductor wafer W to 1000 degrees C. or higher by the light emission from the halogen lamps HL allows a sufficient recovery of the defects.

4. Fourth Preferred Embodiment

Next, a fourth preferred embodiment of the present invention will be described. A configuration of a heat treatment apparatus according to the fourth preferred embodiment is identical to that of the first preferred embodiment. The semiconductor wafer W to be processed is, similarly to the first preferred embodiment, a semiconductor substrate in which impurity is introduced into a source/drain region and an extension region by using an ion implantation method. Moreover, process steps in the heat treatment apparatus of the fourth preferred embodiment are generally identical to those of the first preferred embodiment. The fourth preferred embodiment is different from the first preferred embodiment, in terms of a pattern of the heat treatment on the semiconductor wafer W. In the fourth preferred embodiment, after the second flash heating is completed, a recovery annealing is performed by the halogen lamps HL.

Figure 16:
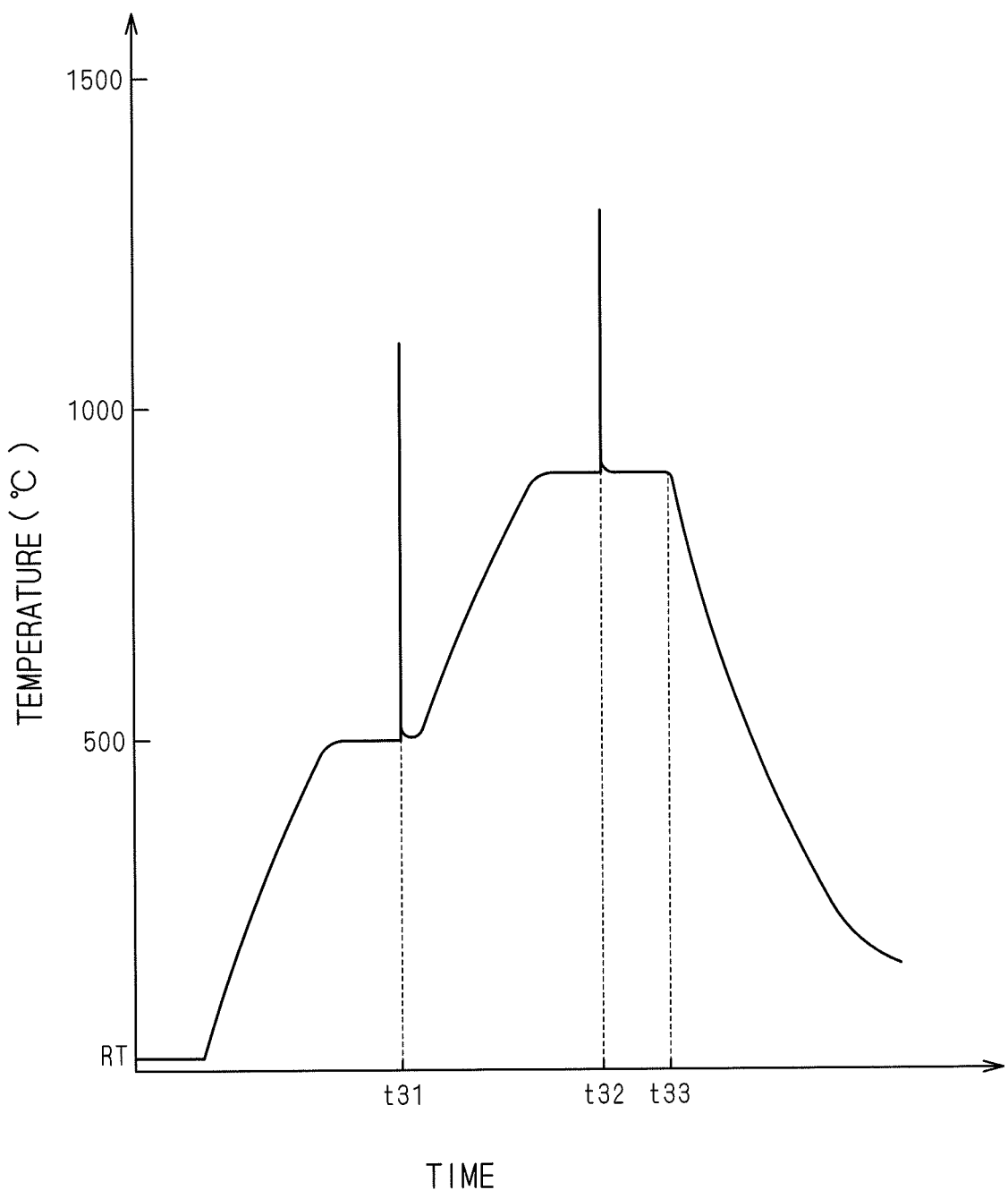
FIG. 16 is a diagram showing a change in the temperature of a surface of a semiconductor wafer according to a fourth preferred embodiment.

FIG. 16 is a diagram showing a change in the temperature of the surface of the semiconductor wafer W in the fourth preferred embodiment. Also in the fourth preferred embodiment, a two-staged flash heating is performed. Firstly, at a time point t31, the first flash heating is performed in which the flash lamp FL emits the first flashing light to the semiconductor wafer W having been heated to the first preheating temperature equal to or lower than 650 degrees C. by the light emission from the halogen lamps HL, so that the temperature of the surface of the semiconductor wafer W reaches 1000 degrees C. or higher. Then, the second flash heating is performed in which, at a time point t32, the flash lamp FL emits the second flashing light to the semiconductor wafer W having been heated to the second preheating temperature equal to or higher than 700 degrees C. by the light emission from the halogen lamps HL, so that the temperature of the surface of the semiconductor wafer W reaches 1100 degrees C. or higher. In a time period of at least two seconds immediately before the flashing light is emitted in each of the first flash heating and the second flash heating, the preheating may be performed in which the temperature of the semiconductor wafer W is maintained constant by the light emission from the halogen lamp HL.

In the fourth preferred embodiment, after the second flash heating is completed, the halogen lamp HL further emits a light to maintain the semiconductor wafer W at a temperature of 850 degrees C. or higher and 950 degrees C. or lower for a time period of one second or more and 30 seconds or less. In other words, after the second flash heating is completed, the halogen lamp HL continues the turned-on state up to the time point t33 to maintain the entire semiconductor wafer W at 850 degrees C. or higher and 950 degrees C. or lower for a time period of one second or more and 30 seconds or less. Then, at a time point t33, the halogen lamp HL is turned off, and thereby the temperature of the semiconductor wafer W quickly drops.

In this heat treatment according to the fourth preferred embodiment, the recovery annealing using the halogen lamp HL is performed after the two-staged flash heating similar to that of the first preferred embodiment. Thus, the two-staged flash heating similar to that of the first preferred embodiment is performed to thereby suppress the diffusion of the implanted impurity while promoting the recovery from the defects introduced at the time of the impurity implantation. Additionally, the impurity can be activated in a good manner. Here, in the first flash heating and the second flash heating, when an intense flashing light is emitted in a very short time period, a defect caused by the emission of the flashing light may sometimes be introduced in the surface layer of the semiconductor wafer W. In the fourth preferred embodiment, after the second flash heating is completed, the recovery annealing is performed in which the halogen lamp HL emits a light to maintain the semiconductor wafer W at 850 degrees C. or higher and 950 degrees C. or lower for a time period of one second or more and 30 seconds or less. Therefore, the defects introduced at the time of the emission of the flashing light can also be recovered.

5. Modification

While some preferred embodiments of the present invention have been described above, various other modifications may be made without departing from the principles of the present invention. For example, although in the second preferred embodiment, the additional flash heating is performed once between the first flash heating and the second flash heating to perform the three-staged flash heating, a four or more staged flash heating in total may be performed in which the additional flash heating is performed at least twice between the first flash heating and the second flash heating. As the number of times the flash heating is performed increases, the impurity is activated in a better manner and additionally the recovery from the crystal defects is promoted.

It may be acceptable that, in the third and fourth preferred embodiments, a heat treatment using the halogen lamps HL is performed after the completion of the three-or-more-staged flash heating similar to that of the second preferred embodiment. This can also provide the same effects as those of the third and fourth preferred embodiments.

Although in the preferred embodiments described above, the surface of the semiconductor wafer W reaches a higher temperature in the flash heating of a later stage (FIG. 11 and FIGS. 14 to 16), this is not limitative. The surface of the semiconductor wafer W may reach the same temperature in a plurality of stages of flash heating, or may reach a higher temperature in a former stage.

Although in the preferred embodiments described above, a single pulse is inputted to the gate of the swithing element 96 for emitting a flashing light once, a plurality of pulses may be intermittently inputted. Intermittently inputting a plurality of pulses to the gate of the swithing element 96 causes a current having a saw-tooth waveform to flow in the circuit including the flash lamp FL so that the flash lamp FL emits a light. In this case, the flash lamp FL successively emits a light to perform an emission of a flashing light, though an output waveform of the light-emission output is different from that of the preferred embodiments described above. Thereby, the flash heating similar to that of the preferred embodiments described above is performed. In a case where the interval (OFF time) of the plurality of pulses is short, it is not necessary to apply the trigger voltage for all of the pulses. If the trigger voltage is applied to the trigger electrode 91 only in inputting the initial pulse to the gate of the swithing element 96, then the current continuously flows in the flash lamp FL without application of the trigger voltage.

Although in the preferred embodiments described above, the semiconductor wafer W is supported in point contact by the bumps 75, the semiconductor wafer W may be supported by other means as long as a heat transfer from the semiconductor wafer W having been heated by the emission of the flashing light can be sufficiently suppressed. For example, the semiconductor wafer W may be supported in plane contact, as long as a member having a sufficiently small thermal conductivity is used. Alternatively, the semiconductor wafer W may be contactless-supported by using a so-called Bernoulli chuck or the like.

Although in the preferred embodiments described above, the process gas supplied to the heat treatment space 65 is a nitrogen gas ($N_2$), this is not limitative. For example, an inert gas such as a helium (He) gas and an argon (Ar) gas, or alternatively an oxygen (O₂) gas or a clean air, may be used. However, since the temperature of the semiconductor wafer W heated in the heat treatment space 65 is raised to a high temperature equal to or higher than several hundreds of degrees C. to 1000 degrees C., an inert gas such as a nitrogen gas, a helium gas, or an argon gas is preferable as the process gas, and in terms of costs, a nitrogen gas is particularly preferable because it is cheap.

Setting of the waveform of the pulse signal is not necessarily by inputting a parameter such as a pulse width from the input part 33 in each time. For example, an operator may directly and graphically input a waveform from the input part 33, or alternatively, a waveform preliminarily set and stored in a storage section such as a magnetic disk may be read out, or further alternatively, a waveform may be downloaded from the outside of the heat treatment apparatus 1.

Although in the preferred embodiments, the IGBT is used as the swithing element 96, this is not limitative. A transistor other than the IGBT may be used. An element capable of turning on and off the circuit in accordance with the waveform of an inputted pulse signal suffices. However, a considerably large amount of power is consumed in a light emission from the flash lamp FL, and therefore it is preferable that an IGBT or a GTO (Gate Turn Off) thyristor appropriate for a large amount of power is adopted as the swithing element 96.

Although in the preferred embodiments described above, the flash heating part 5 includes 30 flash lamps FL, this is not limitative. The number of the flash lamps FL may be any number. Additionally, the kind of the flash lamp FL is not limited to the xenon flash lamp, but a krypton flash lamp may be adoptable. The number of the halogen lamps HL included in the halogen heating part 4 is also not limited to 40, but may be any number.

The substrate to be processed in the heat treatment apparatus according to the present invention is not limited to a semiconductor wafer, but may be a glass substrate used for a flat panel display in, for example, a liquid crystal display device.

While the invention has been shown and described in detail, the foregoing description is in all aspects illustrative and not restrictive. It is therefore understood that numerous modifications and variations can be devised without departing from the scope of the invention.

What is claimed is:

1. A heat treatment method for heating a substrate by emitting light to the substrate, said heat treatment method comprising:
   (a) performing a first flash heating step, to effect said heat treatment, including emitting from a flash lamp a flashing light to the substrate that has been heated to a first preheating temperature equal to or lower than 650 degrees C. by a light emission from a halogen lamp, so that the flashing light causes the temperature of a surface of the substrate to reach 1000 degrees C. or higher; and
   (b) performing a second flash heating step, further effective to obtain said heat treatment of said substrate, performed after said first flash heating step, including emitting from the flash lamp a second flashing light to the substrate after said substrate has been heated to a second preheating temperature higher than said first preheating temperature by a light emission from said halogen lamp, further comprising, after said second flash heating step, a step of emitting a light from said halogen lamp to thereby heat the substrate to a temperature equal to or higher than 1000 degrees C. that exceeds said second preheating temperature.

2. The heat treatment method according to claim 1, wherein said second preheating temperature is 700 degrees C. or higher, in said second flash heating step, the temperature of the surface of the substrate is caused to reach 1100 degrees C. or higher by the emission of the flashing light from said flash lamp.

3. The heat treatment method according to claim 1, further comprising, emitting another flashing light from said flash lamp to the substrate, after said first flash heating step and prior to said second flash heating step.

4. The heat treatment method according to claim 1, wherein in a time period of at least two seconds immediately before said flash lamp emits the flashing light in each of said first flash heating step and said second flash heating step, said halogen lamp emits a light to thereby maintain the temperature of the substrate at a constant temperature.

5. The heat treatment method according to claim 1, wherein in a time period from said first flash heating step to said second flash heating step, the rate of a temperature rise in the substrate caused by said halogen lamp is 10 degrees C. per second or higher and 100 degrees C. per second or lower.

6. The heat treatment method according to claim 1, wherein in said first flash heating step and said second flash heating step, the emission of the flashing light from said flash lamp is implemented by producing an intermittent current flow through said flash lamp by using an insulated gate bipolar transistor.

7. A heat treatment method for heating a substrate by emitting light to the substrate, said heat treatment method comprising:
   (a) performing a first flash heating step, to effect said heat treatment, including emitting from a flash lamp a flashing light to the substrate that has been heated to a first preheating temperature equal to or lower than 650 degrees C. by a light emission from a halogen lamp, so that the flashing light causes the temperature of a surface of the substrate to reach 1000 degrees C. or higher; and
   (b) performing a second flash heating step, further effective to obtain said heat treatment of said substrate, performed after said first flash heating step, including emitting from the flash lamp a second flashing light to the substrate after said substrate has been heated to a second preheating temperature higher than said first preheating temperature by a light emission from said halogen lamp, further comprising, after said second flash heating step, a step of emitting a light from said halogen lamp to thereby maintain the temperature of the substrate at 850 degrees C. or higher and 950 degrees C. or lower for a time period of one second or more and 30 seconds or less.

8. The heat treatment method according to claim 7, wherein said second preheating temperature is 700 degrees C. or higher, in said second flash heating step, the temperature of the surface of the substrate is caused to reach 1100 degrees C. or higher by the emission of the flashing light from said flash lamp.

9. The heat treatment method according to claim 7, further comprising, emitting another flashing light from said flash lamp to the substrate, after said first flash heating step and prior to said second flash heating step.

10. The heat treatment method according to claim 7, wherein in a time period of at least two seconds immediately before said flash lamp emits the flashing light in each of said first flash heating step and said second flash heating step, said halogen lamp emits a light to thereby maintain the temperature of the substrate at a constant temperature.

11. The heat treatment method according to claim 7, wherein
in a time period from said first flash heating step to said second flash heating step, the rate of a temperature rise in the substrate caused by said halogen lamp is 10 degrees C. per second or higher and 100 degrees C. per second or lower.

12. The heat treatment method according to claim 7, wherein
in said first flash heating step and said second flash heating step, the emission of the flashing light from said flash lamp is implemented by producing an intermittent current flow through said flash lamp by using an insulated gate bipolar transistor.

13. A heat treatment apparatus for heating a substrate by emitting a light to the substrate, said heat treatment apparatus comprising:
a support part for supporting the substrate in point contact;
a halogen lamp for emitting a heat treating light to the substrate supported by said support part;
a flash lamp for emitting a flashing light to the substrate supported by said support part; and
a light-emission control part for controlling a light emission from said halogen lamp and said flash lamp, said light-emission control part being configured to control said halogen lamp and said flash lamp so as to perform a first flash heating in which said flash lamp emits the flashing light to the substrate having been heated to a first preheating temperature equal to or lower than 650 degrees C. by a light emission from said halogen lamp, so that the temperature of a surface of the substrate reaches 1000 degrees C. or higher, and then perform a second flash heating in which said flash lamp emits the flashing light to the substrate having been heated to a second preheating temperature higher than said first preheating temperature by a light emission from said halogen lamp, wherein
said light-emission control part is configured to control said halogen lamp such that, after said second flash heating, said halogen lamp emits a light to thereby heat the substrate to a temperature equal to or higher than 1000 degrees C. that exceeds said second preheating temperature.

14. The heat treatment apparatus according to claim 13, wherein
said second preheating temperature is 700 degrees C. or higher,
said light-emission control part is configured to control said halogen lamp and said flash lamp such that the temperature of the surface of the substrate reaches 1100 degrees C. or higher by the emission of the flashing light from said flash lamp in said second flash heating.

15. The heat treatment apparatus according to claim 13, wherein
said light-emission control part is configured to control said flash lamp such that said flash lamp further emits a further heat treating flashing light to the substrate, during a time period between said first flash heating and said second flash heating.

16. The heat treatment apparatus according to claim 13, wherein
said light-emission control part is configured to control said halogen lamp such that said halogen lamp emits a light to thereby maintain the temperature of the substrate at a constant temperature in a time period of at least two seconds immediately before said flash lamp emits the flashing light in each of said first flash heating and said second flash heating.

17. The heat treatment apparatus according to claim 13, wherein
said light-emission control part is configured to control said halogen lamp such that, in a time period from said first flash heating to said second flash heating, the rate of a temperature rise in the substrate caused by said halogen lamp is 10 degrees C. per second or higher and 100 degrees C. per second or lower.

18. The heat treatment apparatus according to claim 13, wherein
said light-emission control part includes an insulated gate bipolar transistor for producing an intermittent current flow through said flash lamp to thereby perform said first flash heating and said second flash heating.

19. A heat treatment apparatus for heating a substrate by emitting a light to the substrate, said heat treatment apparatus comprising:
a support part for supporting the substrate in point contact;
a halogen lamp for emitting a heat treating light to the substrate supported by said support part;
a flash lamp for emitting a flashing light to the substrate supported by said support part; and
a light-emission control part for controlling a light emission from said halogen lamp and said flash lamp, said light-emission control part being configured to control said halogen lamp and said flash lamp so as to perform a first flash heating in which said flash lamp emits the flashing light to the substrate having been heated to a first preheating temperature equal to or lower than 650 degrees C. by a light emission from said halogen lamp, so that the temperature of a surface of the substrate reaches 1000 degrees C. or higher, and then perform a second flash heating in which said flash lamp emits the flashing light to the substrate having been heated to a second preheating temperature higher than said first preheating temperature by a light emission from said halogen lamp, wherein
said light-emission control part is configured to control said halogen lamp such that, after said second flash heating, said halogen lamp emits a light to thereby maintain the temperature of the substrate at 850 degrees C. or higher and 950 degrees C. or lower for a time period of one second or more and 30 seconds or less.

20. The heat treatment apparatus according to claim 19, wherein
said second preheating temperature is 700 degrees C. or higher,
said light-emission control part is configured to control said halogen lamp and said flash lamp such that the temperature of the surface of the substrate reaches 1100 degrees C. or higher by the emission of the flashing light from said flash lamp in said second flash heating.

21. The heat treatment apparatus according to claim 19, wherein
said light-emission control part is configured to control said flash lamp such that said flash lamp further emits a further heat treating flashing light to the substrate, during a time period between said first flash heating and said second flash heating.

22. The heat treatment apparatus according to claim 19, wherein
said light-emission control part is configured to control said halogen lamp such that said halogen lamp emits a light to thereby maintain the temperature of the substrate at a constant temperature in a time period of at least two seconds immediately before said flash lamp emits the flashing light in each of said first flash heating and said second flash heating.

23. The heat treatment apparatus according to claim 19, wherein
said light-emission control part is configured to control said halogen lamp such that, in a time period from said first flash heating to said second flash heating, the rate of a temperature rise in the substrate caused by said halogen lamp is 10 degrees C. per second or higher and 100 degrees C. per second or lower.

24. The heat treatment apparatus according to claim 19, wherein
said light-emission control part includes an insulated gate bipolar transistor for producing an intermittent current flow through said flash lamp to thereby perform said first flash heating and said second flash heating.

* * * * *